United States Patent [19]

Kuroki et al.

[11] Patent Number: 4,830,500
[45] Date of Patent: May 16, 1989

[54] ALIGNMENT DEVICE

[75] Inventors: Yoichi Kuroki, Kawasaki; Ruri Onoda, Tokyo, both of Japan

[73] Assignee: Canon Kabushiki Kaisha, Tokyo, Japan

[21] Appl. No.: 850,710

[22] Filed: Apr. 11, 1986

[30] Foreign Application Priority Data

| Apr. 15, 1985 | [JP] | Japan | 60-078567 |
| Apr. 15, 1985 | [JP] | Japan | 60-078568 |
| Apr. 16, 1985 | [JP] | Japan | 60-079415 |
| Apr. 19, 1985 | [JP] | Japan | 60-082613 |
| Apr. 19, 1985 | [JP] | Japan | 60-082614 |
| Dec. 13, 1985 | [JP] | Japan | 60-279329 |

[51] Int. Cl.$^4$ .................................. G01B 11/00
[52] U.S. Cl. .................... 356/401; 364/559
[58] Field of Search .......... 356/400, 401, 394; 369/559

[56] References Cited

U.S. PATENT DOCUMENTS

| 4,599,000 | 7/1986 | Yamada | 356/400 |
| 4,639,604 | 1/1987 | Murakami et al. | 356/400 |
| 4,641,257 | 2/1987 | Ayata | 356/400 |
| 4,688,088 | 4/1987 | Hamazaki et al. | 356/401 |

Primary Examiner—Richard A. Rosenberger
Attorney, Agent, or Firm—Fitzpatrick, Cella, Harper & Scinto

[57] ABSTRACT

An alignment device usable in the processes for manufacture of semiconductor integrated circuits, for bringing a mask and a semiconductor wafer into a predetermined positional relation by use of alignment marks, prior to effecting transfer of an integrated circuit pattern of the mask onto a photosensitive layer of the wafer. The alignment device is provided with a function of searching a mark signal included in a detection signal for the wafer, on the basis of the dimension of the alignment mark. By this, the alignment mark signal can be accurately detected irrespective of the fact that a noise component might be included in the detection signal for the wafer due to effects of the existence of the photosensitive layer or the like. In another aspect, the alignment device is operable in an operation mode including the mark signal searching step and in another operation mode not including the signal searching step. The selection of the operation mode is determined in accordance with the magnitude of the noise component included in the detection signal for the wafer, whereby an unpreferable decrease in the throughput is prevented. In a further aspect, signals from alignment marks of the mask and the wafer are processed in a parallel fashion whereby substantial reduction in the signal processing time is assured.

4 Claims, 24 Drawing Sheets

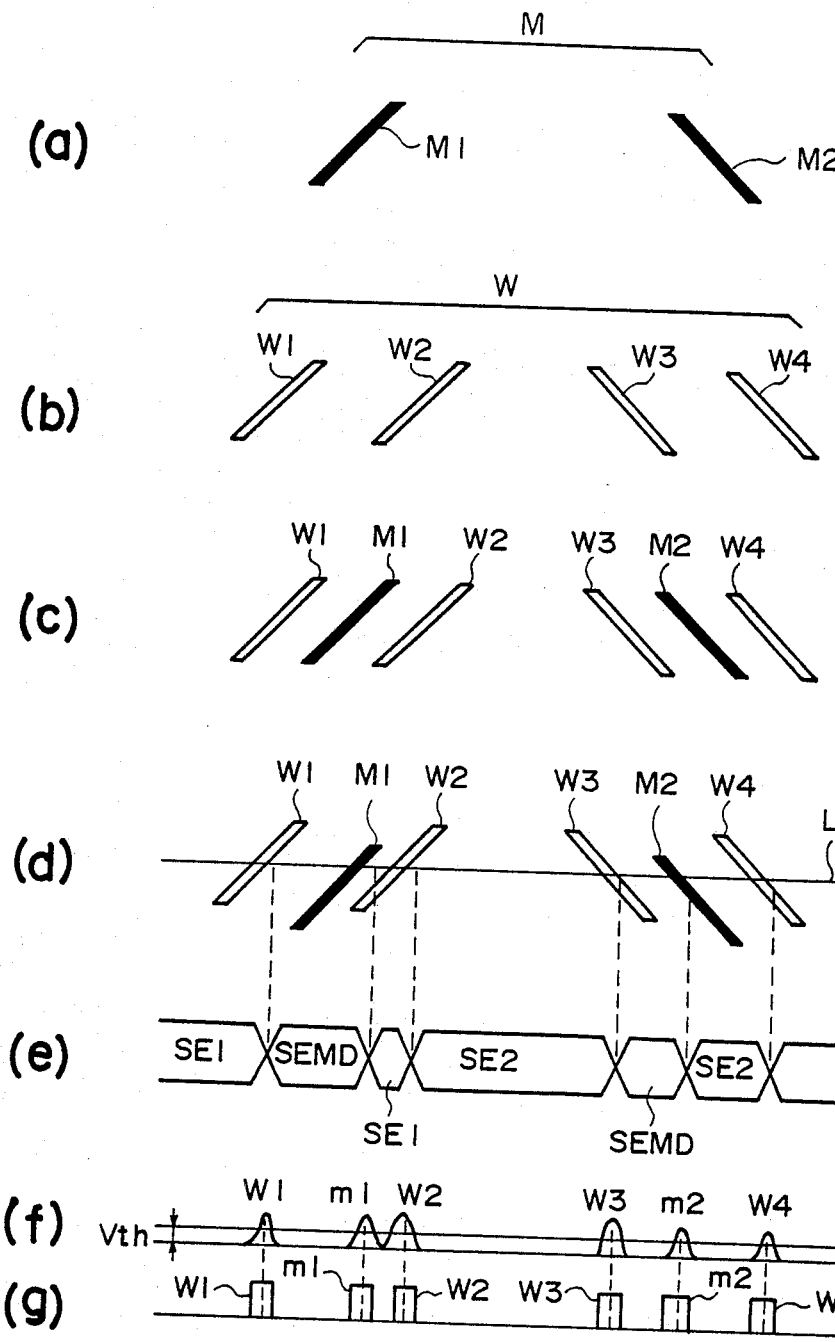
F I G. 1

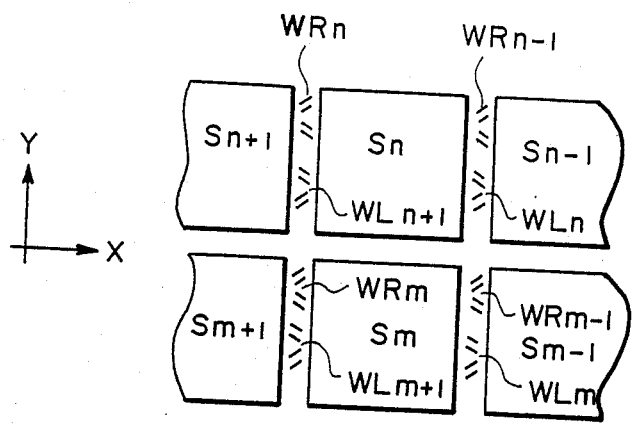
F I G. 6

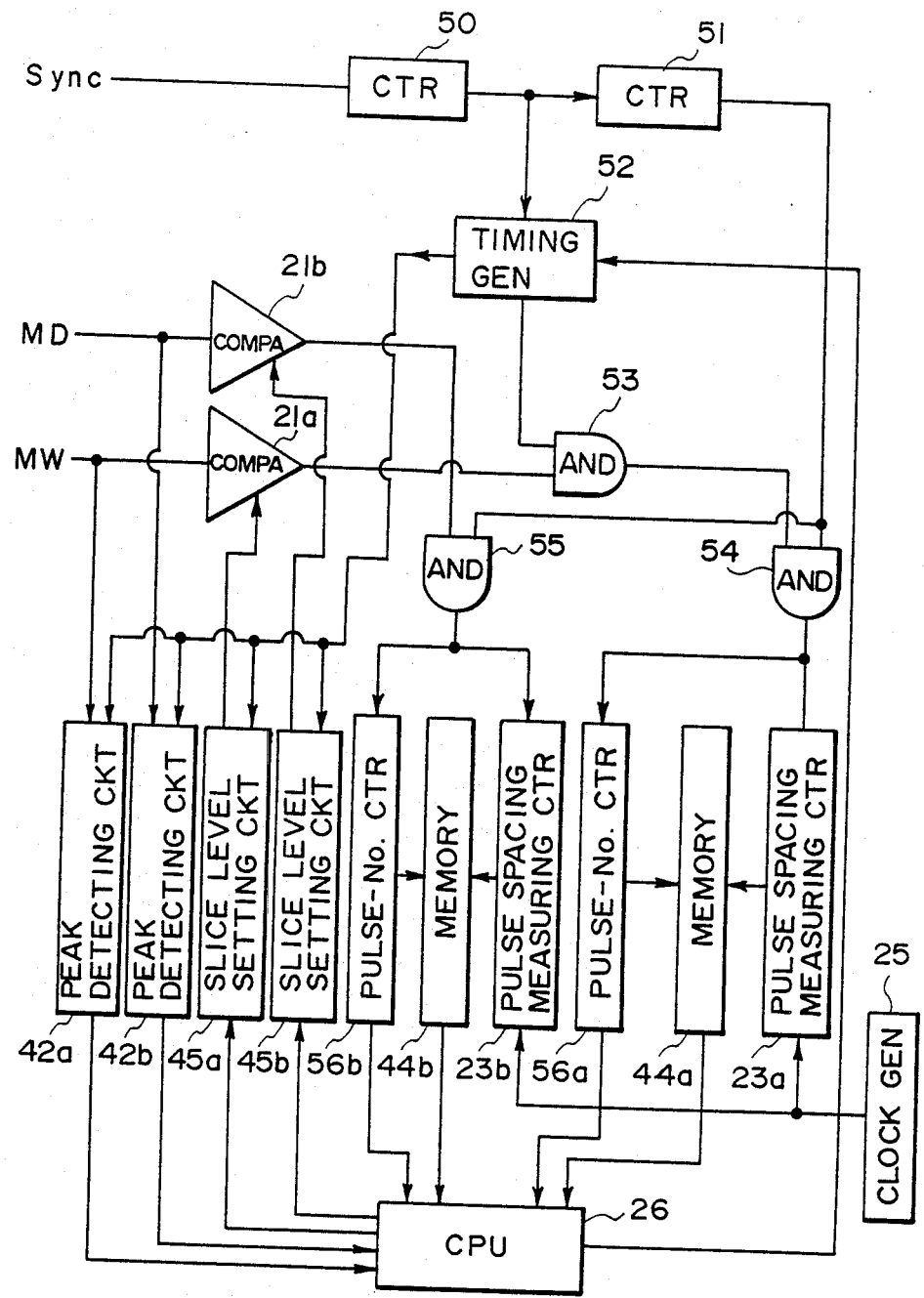
F I G. 9

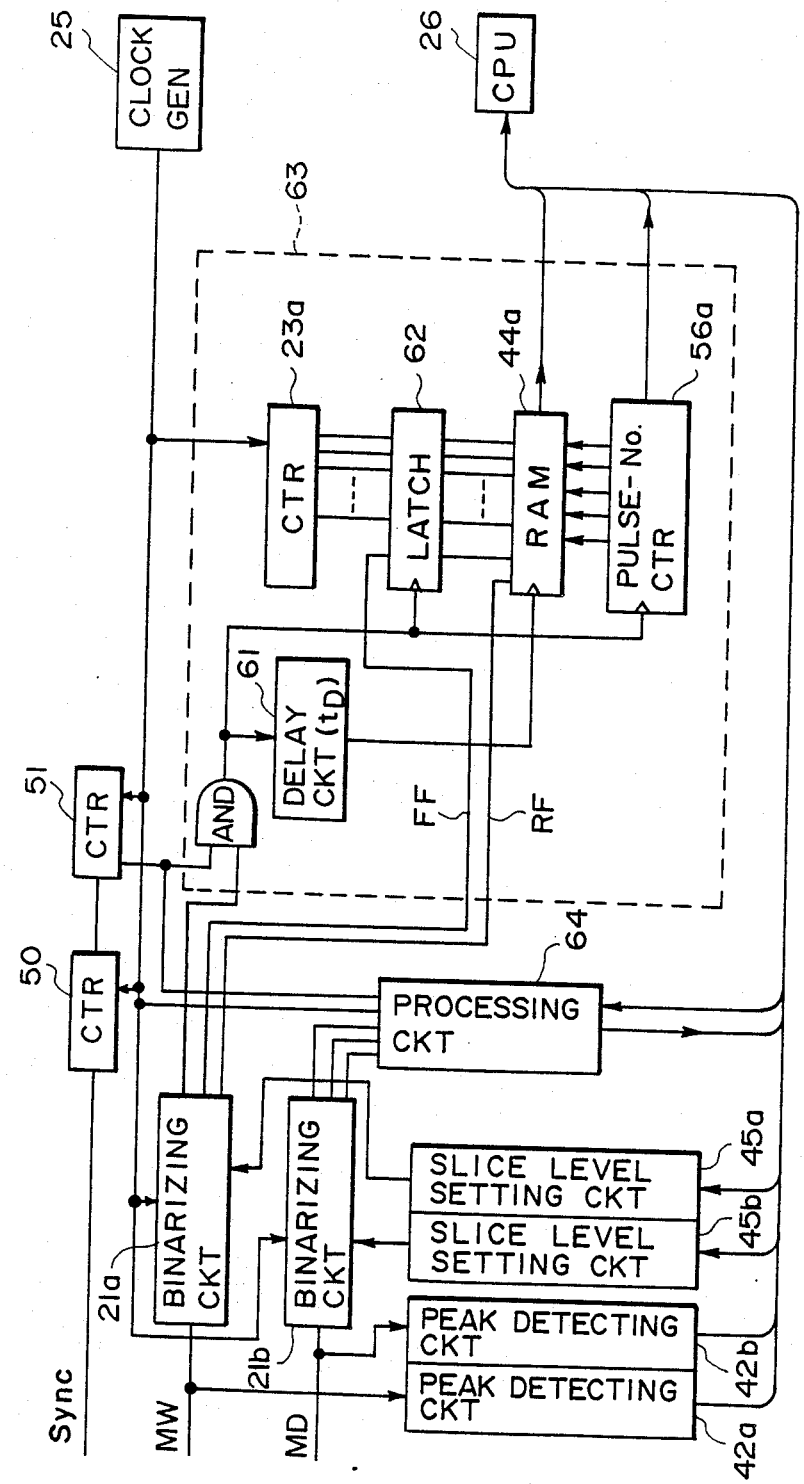
F I G. 14

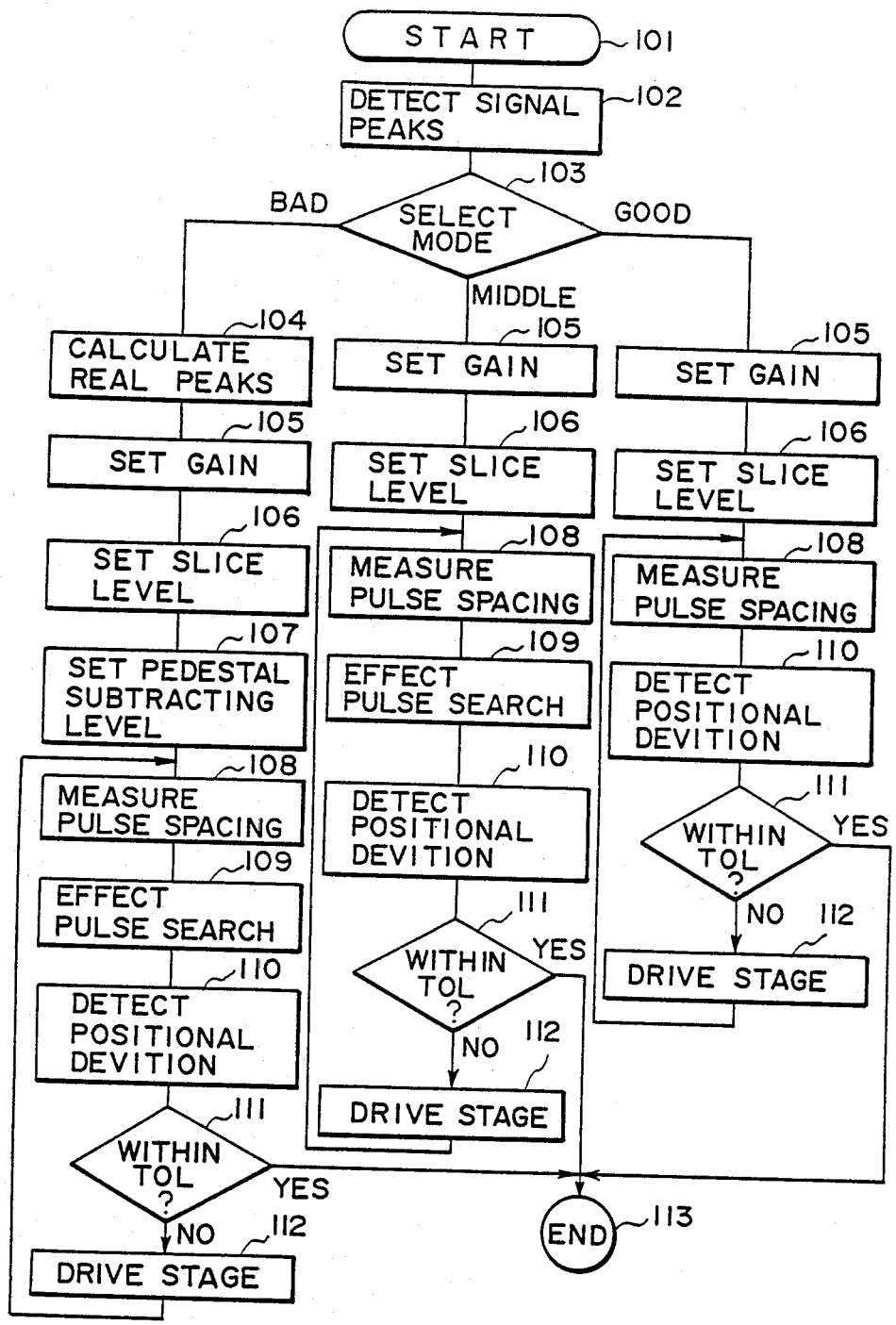
F I G. 23A

ALIGNMENT DEVICE

FIELD OF THE INVENTION AND RELATED ART

This invention relates to an alignment device and, more particularly, to an alignment device usable in processes for manufacture of semiconductor devices such as integrated circuits, for bringing a mask or reticle having an integrated circuit pattern and a semiconductor wafer into a predetermined positional relation by use of alignment marks formed on the mask and the wafer, in order that the integrated circuit pattern of the mask is accurately transferred onto the semiconductor wafer.

In many semiconductor device manufacturing exposure apparatuses, the mask or reticle (hereinafter simply "mask") and the wafer are automatically aligned with each other by scanning, with a laser beam, alignment marks preparatorily formed on the mask and the wafer. That is, light scatteringly diffracted from edges of the alignment marks caused during the laser beam scan is detected as positional information. More specifically, of the light reflected from the alignment, marks, a specularly reflected component is optically intercepted at a light receiving portion and, thereafter, the intensity of the scatteringly diffracted light from each of the edges of the alignment marks is photoelectrically converted into an electric pulse. The positions of the thus obtained pulses are detected by use of a clock counter or the like, whereby the distance or positional deviation between the mask alignment mark and the wafer alignment mark is detected.

FIG. 1 shows an example of the manner of mask-to-wafer alignment by use of alignment marks. In the FIG. 1 example, the mask is formed with an alignment mark M comprising mark patterns M1 and M2 such as shown in a portion (a) of FIG. 1, while the wafer is formed with an alignment mark W comprising mark patterns W1-W4 such as shown in a portion (b) of FIG. 1. These alignment marks M and W of the mask and the wafer are scanned with a laser beam along a path L, such as shown in a portion (d), whereby positional deviation between these alignment marks is detected. Then, in accordance with the detected positional deviation, one of the mask and the wafer is displaced)so as to bring them into alignment with each other, such as shown in a portion (c) of FIG. 1.

Usually, the alignment system of the type shown in FIG. 1 is arranged to produce selection signals such as shown in a portion (e) of FIG. 1, in order to extract only mark signals m1, m2 and w1-w4, shown in a portion (f) of FIG. 1, which correspond to the mark patterns M1, M2 and W1-W4 of the alignment marks M and W shown in the portion (d) of FIG. 1 and which are produced during the scan of the alignment marks M and W with the laser beam on park L. More specifically, in response to the start of the laser beam scan, a selection signal SE1 is outputted for the sake of detection of the mark pattern W1. Then, another selection signal SEMD for the sake of detection of the mark pattern M1 is outputted at a time when the fall of a pulse of a digital signal w1, which is shown in a portion (g) of FIG. 1 and which is obtained by binarizing the mark signal W1 shown in the portion (f) of the same Figure, is discriminated. Subsequently, in response to discrimination of a digital signal m1 corresponding to the mark pattern M1, another selection signal SE1 is outputted. For the remaining mark patterns W3, M2 and W4, selection signals SE2, SEMD and SE2 are outputted in a similar manner. By this, pulse-train signals such as shown in the portion (g) of FIG. 1, which are formed when the signals shown in the portion (f) of FIG. 1 are outputted from the photoelectric detecting means, are selected or extracted in accordance with the mark patterns of the alignment marks.

Thus, from the signals in the form of the pulse train determined on the basis of the above-described signal selection, accurate detection of the positional deviation of the alignment marks M and W and accurate alignment of the mask and the wafer are easily attainable, if no component other than the signal component provided by the scatteringly reflected light from the alignment marks is included in the signal output of the photoelectric detecting means. Practically, however, it is difficult to obtain, from the photoelectric detecting means, signals having a very high signal-to-noise ratio (S/N ratio) such as shown in the portion (f) of FIG. 1. Particularly for the semiconductor wafer, as compared with the mask, there is a high possibility of inclusion of a noise component, because the wafer is coated with a photosensitive material or an aluminum material. In the alignment system of the type described in the foregoing, the selection of signals corresponding to the mark patterns M1, M2 and W1-W4 is determined on the basis of the arrival or detection of digital pulses. If, therefore, a noise signal N is included in the train of signals M1, M2 and W1-W4 corresponding to the alignment marks M and W, such as shown in a portion (a) of FIG. 2, the selection signals are produced in the manner such as shown in a portion (b) of FIG. 2 with the result that, for the sake of measurement of the pulse spacings, the noise signal N is picked up as if it is a signal corresponding to one of the mark patterns of the alignment marks. Thus, an incorrect pulse train such as shown in a portion (c) of FIG. 2 is outputted.

Depending on the material of the surface of the wafer, e.g. for a wafer having been subjected to vacuum deposition of aluminum material, there is a high possibility of occurrence of irregular reflection of the light by the rough aluminum surface. Such irregular reflection light enters into the photoelectric detecting means. This results in uneven rise of the base line of the output from the photoelectric detecting means, such as shown in a portion (a) of FIG. 3. Hereinafter, the portion of the output of the photoelectric detecting means which corresponds to the rise of the base line will be referred to as "pedestal". Correct detection of peaks of alignment mark signals for the wafer is attainable if a suitable slice level such as shown at SL1 is set. If the set slice level is suitable, a pulse train such as shown in a portion (b) of FIG. 3 is obtainable. If, on the other hand, a slice level such as shown at SL2 which is lower than the maximum level of the pedestal component is set (Vpd is the average of the pedestal component), an unpreferable pulse train such as shown in a portion (c) of FIG. 3 is produced. In such case, it is necessary to change the slice level and to effect again the signal processing until such a pulse train as having a correct or predetermined number of pulses is obtained.

Also, it is possible that the output of the photoelectric detecting means which is in the form of an analog signal has a small real peak Rp (=maximum peak Pmax - pedestal Pvd) of an order of 10% of the pedestal component Vpd. For the analog signal having such small real peak Rp, the setting of a suitable slice level itself for allowing detection of the predetermined number of pulses is attainable by repeatedly effecting a working loop comprising measurement, determination of an amplification rate and a slice level, and re-measurement. If, in such case, the maximum peak Pmax is of an order of 1 V, it is necessary to further increase the amplification rate so as to raise the maximum peak Pmax to a level of an order of 2 V, such as shown at Pmax' in a portion (b) of FIG. 4. If this is done, however, the ratio of the real peak Rp to the pedestal component Vpd is not changed. So, there still remain difficulties in the setting of a suitable slice level and thus difficulties in correct detection of pulses and in accurate alignment of the mask and the wafer.

As described hereinbefore, in the alignment system of the type set forth above, it is not easy to attain high-accuracy and high-speed alignment of an object, where a detection signal from the object has a large pedestal component and/or a low S/N ratio.

SUMMARY OF THE INVENTION

It is accordingly a primary object of the present invention to provide an alignment device which allows accurate detection of a signal from an alignment mark formed on an object, while avoiding confusion with a noise component, thereby to attain high-accuracy alignment of the object.

It is another object of the present invention to provide an alignment device which allows reduction in time necessary for processing a signal from an alignment mark formed on an object, thereby to attain high-speed alignment of the object.

Briefly, according to one aspect of the present invention, there is provided an alignment device for adjusting the position of an object by use of a mark formed in a mark region provided on the object. The device comprises means for photoelectrically scanning the mark region, said scanning means producing, in accordance with the scan, an electric output corresponding to the mark region; means for extracting out of the output of said scanning means a mark signal corresponding to the mark formed in the mark region, on the basis of a length of the mark signal with respect to time; and means for adjusting the position of the object on the basis of the mark signal extracted out of the output of the scanning means.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is an explicative view showing an example of alignment marks of a mask and a wafer and showing an example of an idealistic detection signal and the timing for detecting mark signals.

FIG. 6 is a schematic view showing an example of layout of alignment marks on a wafer.

FIG. 9 is a block diagram showing an alignment device according to an embodiment of the present invention.

FIG. 14 is a block diagram showing an alignment device according to another embodiment of the present invention.

FIG. 23A is a flow chart showing the operation of the alignment device according to the FIG. 19 embodiment.

DESCRIPTION OF THE PREFERRED EMBODIMENTS

Figure 5:
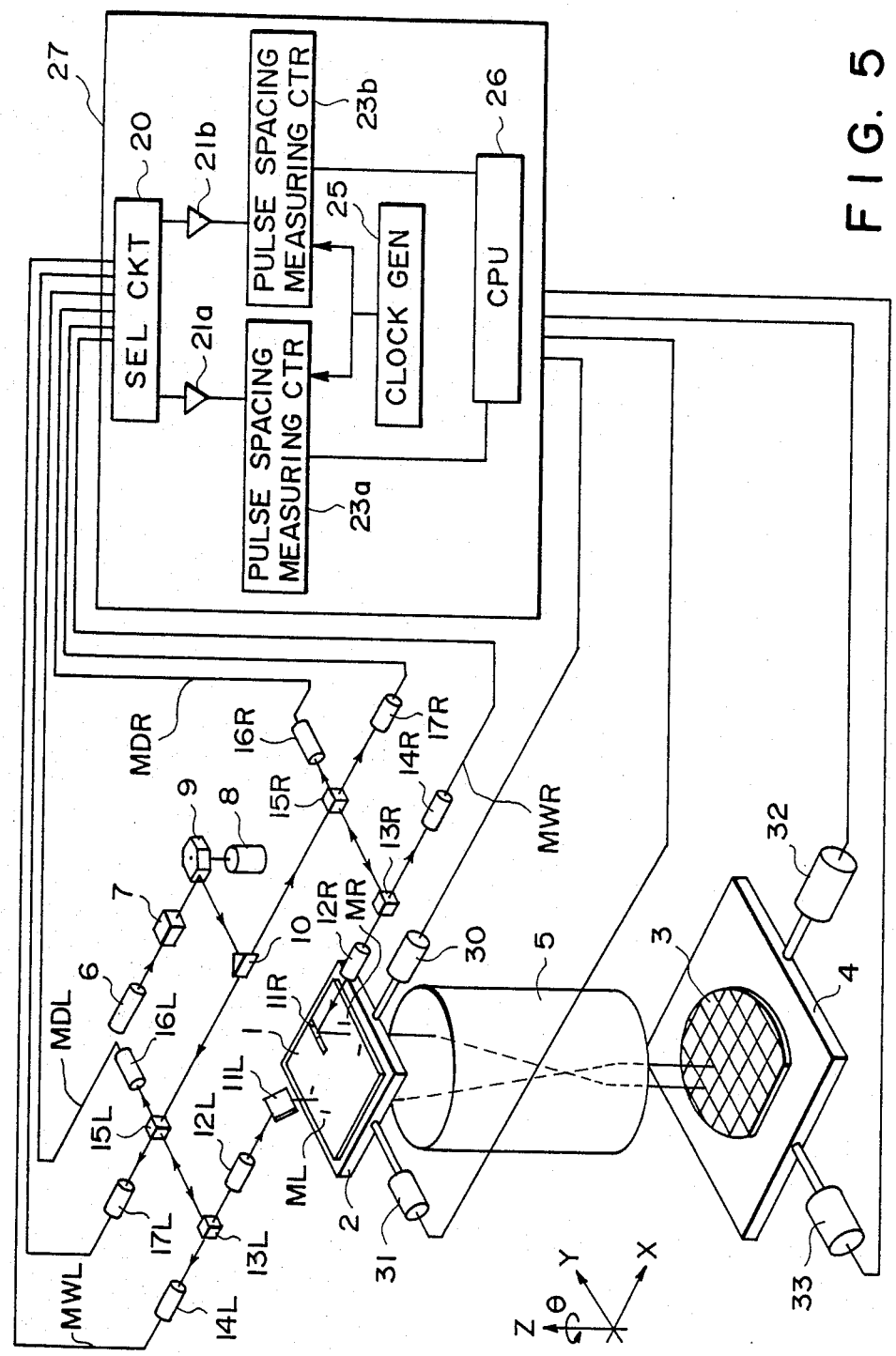
FIG. 5 is a schematic and diagrammatic view showing a portion of a semiconductor device manufacturing exposure apparatus having an alignment device according to the present invention.

Referring now to FIG. 5, there is shown a semiconductor device manufacturing exposure apparatus of step-and-repeat type, having an alignment system to which the present invention is applied.

In FIG. 1, a mask 1 is held by a mask stage 2, and a semiconductor wafer 3 having a photosensitive layer applied to its surface is held by a wafer stage 4. The wafer stage 4 is arranged to displace the wafer 3 held thereon in each of X and Y directions. A projection lens system 5 is provided to project in a reduced scale a circuit pattern of the mask 1 onto the wafer 4 when the mask pattern is to be printed on the wafer 4 by use of light supplied from an unshown light source. The mask 1 is formed with a left-hand alignment mark ML comprising mark patterns M1 and M2, and a right-hand alignment mark MR comprising similar mark elements M1 and M2. The wafer 3 is formed with two alignment marks for each of plural shot areas thereon. That is, for a particular shot area Sn, such as shown in FIG. 6, a left-hand alignment, mark WLn comprising mark elements W1-W4, and a right-hand alignment mark WRn comprising mark elements W1-W4 are formed in scribe lines related to the shot area Sn. Each of the shot areas, if it is within an effective area of the wafer surface, is formed with similar left-hand and right-hand alignment marks.

Referring back to FIG. 5, a polygonal mirror 9 is made rotatable by means of a motor 8. A laser source 6 such as, for example, a laser tube emits a laser beam. The laser beam emitted from the laser tube 6 is shaped into sheet-like laser beams such as shown in a portion (g) of FIG. 7 by means of an optical block 7. For this optical block 7 forming sheet-like beams La and Lb, reference may be made to U.S. Pat. No. 4,669,883.

The laser beam from the optical block 7 is scanningly deflected by the polygonal mirror 9 and, by means of a roof mirror 10, first and second halves of the laser beam scan are separated. That is, in the first half of one scan, the laser beam is deflected to one of a left-hand detecting optical system comprising elements denoted in FIG. 5 by numerals with suffix L and a right-hand detecting system comprising elements denoted in FIG. 5 by numerals with suffix R. On the other hand, in the second half of the same scan, the laser beam is deflected to the other of the left-hand and right-hand detecting systems. Thus, the laser beam from the mirror 10 is directed to a beam splitter 15L (15R), a polarization beam splitter 13L (13R), an objective lens 12L (12R) and a mirror 11L (11R), whereby the left-hand alignment marks ML and WL and the right-hand alignment marks MR and WR of the mask 1 and the wafer 3 are scanned by the laser beams in the first and second halves of one scan. Of course, the wafer alignment marks are scanned by the laser beams passed through the projection lens system 5. A portion of the laser beam from the mirror 10 is transmitted by the beam splitter 15L (15R) so that it is directed to a photoelectric detector 17L (17R).

The scatteringly reflected light from the marks ML, MR, WL and WR is guided by the mirror 11L (11R) and the objective lens 12L (12R) in this order, and it is incident on the polarization beam splitter 13L (13R). By means of an unshown quarter waveplate provided in the projection lens system 5, the scatteringly reflected light from the alignment marks WR and WL has a direction of polarization which is different from that of the light passing through the projection lens system 5 toward the wafer 3. Therefore, the scatteringly reflected light from the mark WL (WR) passes through the polarization beam splitter 13L (13R), such that it is directed to a photoelectric detector 14L (14R). On the other hand, the scatteringly reflected light from the mark ML (MR) is reflected by the polarization beam splitter 13L (13R) so that, after passing through the beam splitter 15L (15R), it is incident on a photoelectric detector 16L (16R). Hereinafter, the line including the detector 14L (14R) for detecting the light reflected from the wafer alignment mark and passed through the wafer is referred to as "MW-line", while the line including the detector 16L (16R) for detecting the light directly reflected from the wafer alignment mark ML (MR) will be referred to as "MD-line".

Figure 7:
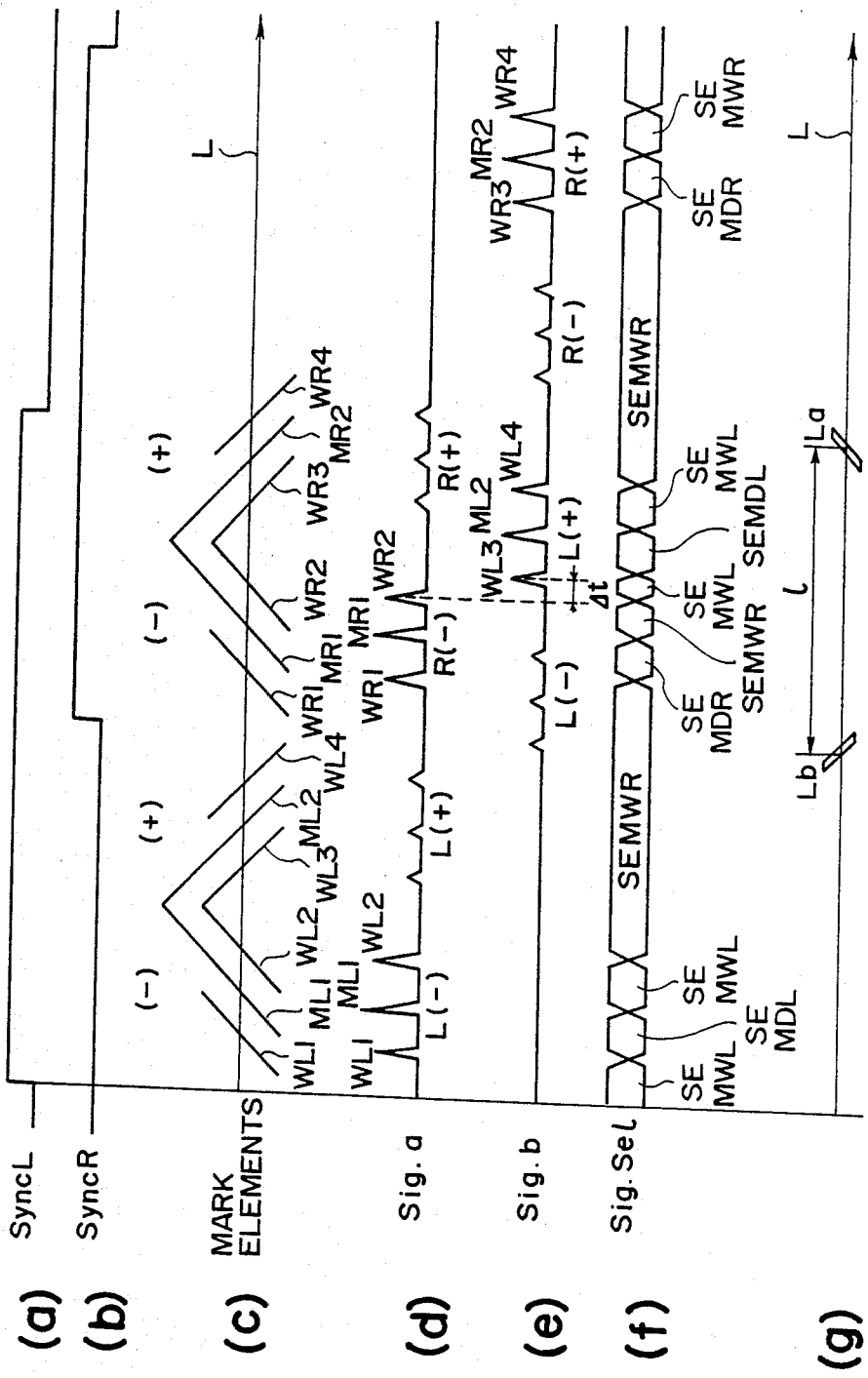
FIG. 7 is an explicative view showing the timing for detecting mark signals in the alignment device used in the semiconductor device manufacturing exposure apparatus shown in FIG. 5.

Of the output signals from these photodetectors, the output signals of the detectors 17L and 17R are used as synchronization signals SyncL and SyncR shown in portions (a) and (b) of FIG. 7. The output signals of the detectors 14L, 14R, 16L and 16R are introduced into a control circuit 27. In response to the switching timing set for the left-hand and right-hand lines, the MW-line signals and the MD-line signals in one of the left-hand and right-hand lines are selected by a selecting circuit 20. The output signals in each of the left and right lines are in the form of analog signals such as shown in the portion (f) of FIG. 1. In this Figure, m1 and m2 denote signals provided by the scatteringly reflected lights from the marks M1 and M2 of the mask 1, while w1-w4 denote signals provided by the scatteringly reflected lights from the marks W1-W4 of the wafer 3. Each of these signals is binarized by a corresponding one of binarizing circuits (comparators) 21a and 21b provided in the control circuit. Thus, a pulse train such as shown in the portion (g) of FIG. 1 is obtained. The pulse spacings between these pulses are measured by use of a measuring clock oscillator 25 and pulse spacing measuring circuits (counters) 23a and 23b. A central processing unit 26 (hereinafter "CPU") reads out the contents of the measuring circuits 23a and 23b and, from the thus counted valves, the CPU 26 calculates relative positional deviation between the mask 1 and the wafer 3 in each of the X, Y and $\theta$ (rotational) directions. Then, at least one of motors 30-33 is driven to displace the mask stage 2 and/or the wafer stage 4 in the X and/or Y direction, so as to bring the mask 1 and the wafer 3 into a predetermined positional relation. As for the $\theta$ direction, the wafer is rotationally displaced by means of an unshown $\theta$-stage.

Details of the manner of detection of pulses will now be described. A portion (c) of FIG. 7 shows the alignment marks ML, MR, WL and WR which are arrayed in this Figure in a time-serial manner in accordance with the direction of laser beam scan. The mark elements of these alignment marks are continuously scanned with a pair of sheet-like laser beams La and Lb shown in the portion (g) of FIG. 7 and having a constant spacing l. Each time, during such scan, one of the sheet-like beams is aligned with one of the mark patterns extending substantially in parallel to the aforesaid one sheet-like beam, an output signal of substantially Gaussian distribution having a constant pulse width and a constant signal level is produced in the control circuit 27. The signals obtainable in response to the scan by the beams La and Lb are shown in the portions (d) and (e) of FIG. 7. After start of scanning by the laser beams along the scan line L, the laser beam La first picks up a first one of the mark patterns having negative inclination and, with a lag of time corresponding to the spacing l of the laser beams, the laser beam Lb picks up a first one of the mark patterns having positive inclination. In accordance with the mark pattern detected, the CPU 26 in the control circuit 27 produces and supplies a selection signal, to a selecting circuit 20, instructing which one of the outputs of the photoelectric detectors in the left MW-line, right MW-line, left MD-line and right MD-line is to be picked up as the position detecting signal. Thus, in accordance with the selection signal, switching for the input signals is effected. Also, the CPU 26 supplies the selection signal to each of the comparators 21a and 21b and the pulse spacing measuring circuits 23a and 23b, provided in the control circuit 27, whereby signal processing for the MD-line and MW-line signals in the left and right signal processing systems is changed over. The change-over of the selection signal for the sake of detection of the next mark pattern is effected in response to the fall of a signal, in a binary form, from the mark pattern which has just been detected. For the mark patterns of the portion (c) of FIG. 7, the CPU 26 produces selection signals such as shown in a portion (f) of FIG. 7.

Figure 8:
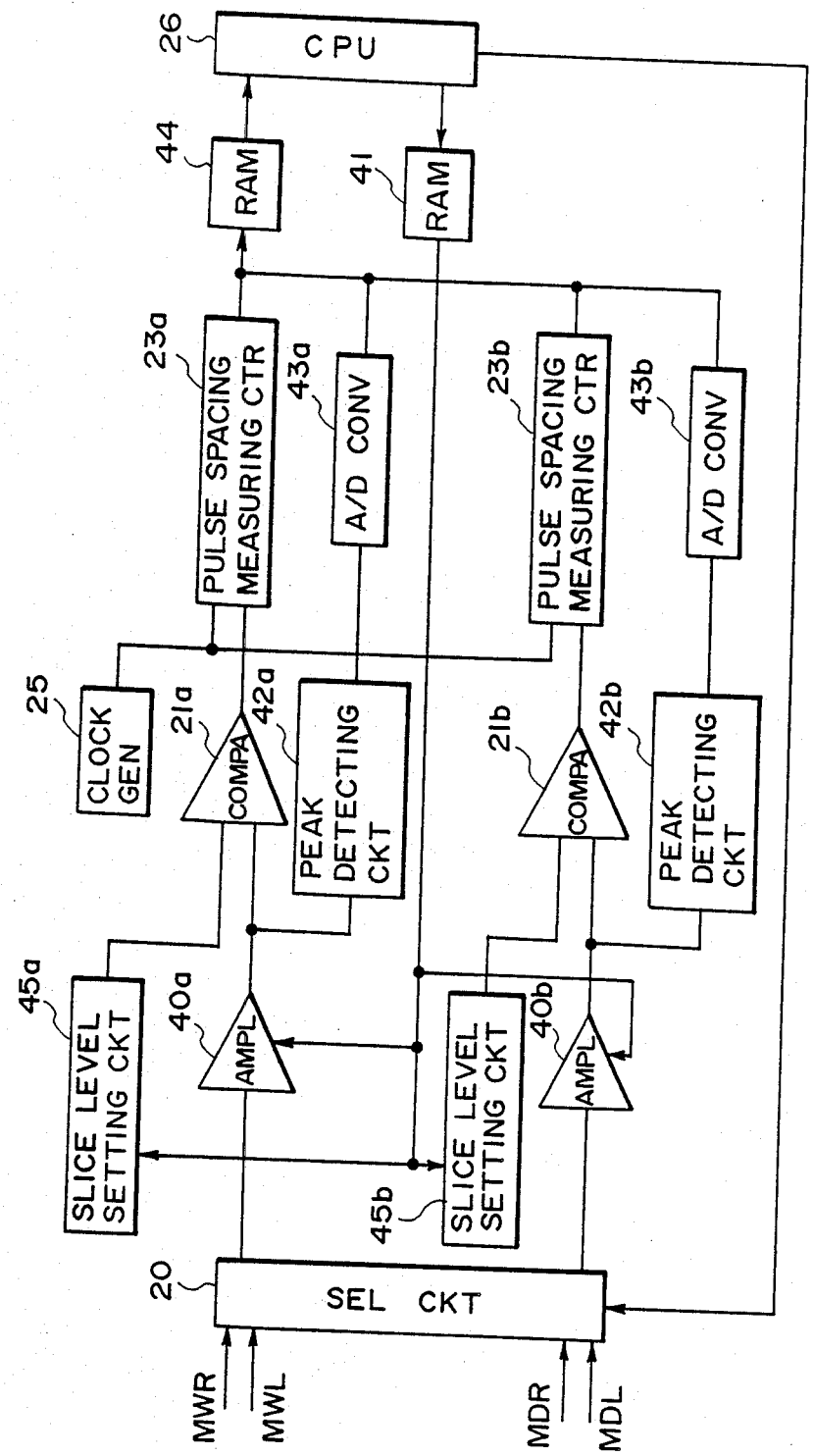
FIG. 8 is a block diagram showing a control system used in the apparatus of FIG. 5.

FIG. 8 shows details of the control circuit 27. The selection circuit 20 is provided to select one of the left-line and the right-line. That is, the output signals of the left MW-line (MWL) and the left MD-line (MDL) photodetectors or, alternatively, the output signals from the right MW-line (MWR) and the right MD-line (MDR) photodetectors are selected by the selection circuit 20. The MW-line signals are amplified by a variable-gain amplifier 40a. On the basis of the preparatorily made detection, the CPU 26 writes, into a random access memory 41 (hereinafter "RAM"), such gain that is effective to get a suitable level of MW-line signals. And, the gain of the variable-gain amplifier 40a is controlled in accordance with the output of the RAM 41. Also, the RAM 41 stores therein the data about the slice level (threshold voltage) outputted from the CPU 26. MW-line peak detecting circuit 42a is provided to detect the peak of the MW-line signal at the timing of the selection signal which is shown in the portion (f) of FIG. 7 and which is supplied thereto from the CPU 26, that is at the time of arrival of the signal. The output of the peak detecting circuit 42a is converted into a digital signal by an analog-to-digital converter 43a (hereinafter "A/D converter"), and the thus obtained digital signal is stored into a RAM 44. A slice level setting circuit 45a is arranged to convert, into an analog signal, the data written in the RAM 41 by the CPU 26, and to set its threshold voltage in the MW-line comparator 21a. The above-described pulse spacing measuring circuit 23 counts up the pulse spacings in the binary-coded signal train outputted from the MW-line comparator 21a, on the basis of the clocks supplied from the measuring clock oscillator 25. The thus detected pulse spacings are sequentially stored into the RAM 44. The components denoted in this Figure by numerals with a suffix "b" which are related to the processing of the MD-line signals have substantially the same function as of those of the elements in the MW-line.

Embodiments of the present invention, each of which is applicable to an alignment device having the fundamental structure described in the foregoing, will now be explained. In the following part of the Specification description will be made only with reference to one of the detecting systems of the left and right lines, unless it is not sufficient for the sake of understanding of the present invention. Also, the elements in the embodiments having similar or corresponding functions as of those described hereinafter are denoted by the same reference numerals.

FIG. 9 shows an alignment device according to one embodiment of the present invention. In FIG. 9, a counter 50 starts counting of time periods $T_{pw1}$ and $T_{pw2}$ shown in a portion (d) of FIG. 10 in response to generation of a synchronization signal Sync, shown in a portion (c) of FIG. 10, at the photoelectric detector 17L (17R) shown in FIG. 5. A counter 50 is arranged to start counting a time period Tw for the generation of a window signal, each time the counting by the counter 50 for the time period $T_{pw1}$ or $T_{pw2}$ is completed. During the time period Tw, the window signal of high level is inputted to each of "and" gates 54 and 55. A timing generating circuit 52 starts counting, each time the counting at the counter 50 for the timing period $T_{pw1}$ or $T_{pw2}$ is completed. The timing generating circuit 52 continues counting for a timing period $T_D$ which has preparatorily been set by the CPU 26. Thereafter, for another time period $T_G$ which has also been preparatorily set by the CPU 26, the timing generating circuit 52 supplies an "and" gate 53 with a low level signal such as shown in the portion (d) of FIG. 10. In response to the signal from the timing generating circuit 52 and the window signal from the counter 51, the "and" gates 53 and 54 are operated to gate the MD-line signals from the alignment mark WL (WR) of the wafer 3 at the timing such as shown in a portion (e) of FIG. 10.

Each of the MW-line signal and the MD-line signal outputted from the photoelectric detectors 14L (14R) and 16L (16R), respectively, is binarized by the comparator 21a or 21b, independently from the other. Subsequently, the MW-line signal is inputted into the "and" gate 53, while on the other hand the MD-line signal is inputted into the "and" gate 55. The "and" gate 55 is arranged to gate the MD-line signal in response to the window signal from the counter 51. Thus, during a time period such as shown in the portion (e) of FIG. 10 during which both the window signal from the counter 51 and the output signal from the timing generating circuit 52 are maintained at the high level, the MW-line signal is supplied to each of a pulse spacing measuring counter 23a and a pulse-number counting circuit 56a. On the other hand, in a time period during which the window signal from the counter 51 is maintained at the high level, the MD-line signal is supplied to each of a pulse spacing measuring counter 23b and a pulse-number counting circuit 56b.

Figure 10:
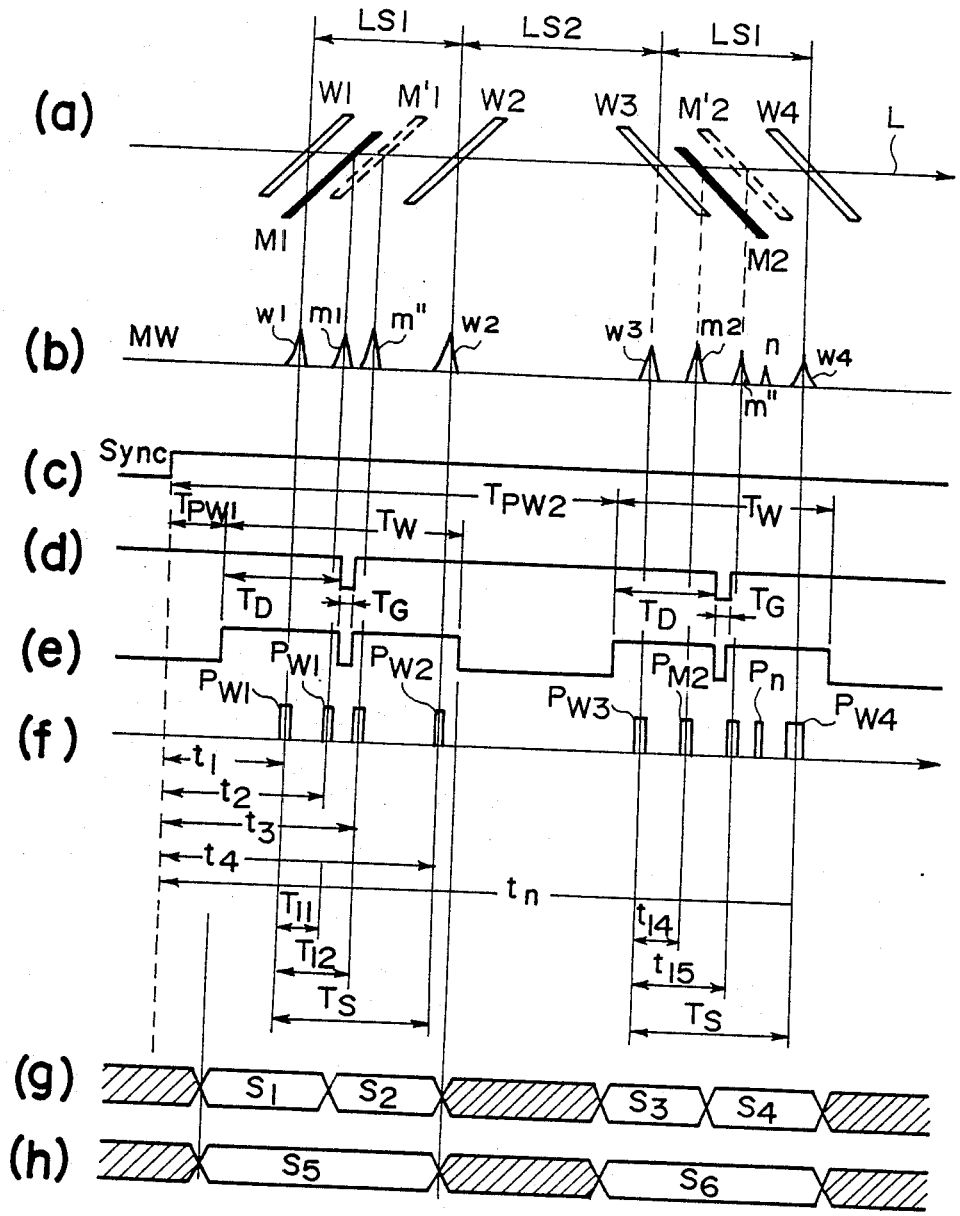
FIG. 10 is an explicative view showing detection signals for alignment marks of a mask and a wafer in the case of the FIG. 9 embodiment, and showing the timing for detecting mark signals.

Each of the counters 23a and 23b is adapted to be incremented by one, each time a mark detection signal PM1, PM2, PW1, PW2, PW3 or PW4 such as shown in a portion (f) of FIG. 10 is outputted from corresponding one of the "and" gates 54 and 55, thereby to renew the address of a corresponding one of the memories 44a and 44b. And, each time a mark detection signal is selected at the "and" gate 54 or 55, the content of the counter 23a or 23b is written in the renewed address of the memory 44a or 44b. After completion of the scan by the laser beam L, the CPU 26 reads the contents of the memories 44a and 44b, whereby the positions of the alignment mark patterns M1, M2 and W1-W4 can be detected.

The control system further includes two threshold setting circuits (slice level setting circuits) 45a and 45b, each of which is provided to determine a threshold voltage Vth for corresponding one of the comparators 21a and 21b. Each of the setting circuits 45a and 45b comprises a RAM having an address adapted to be renewed by the output from corresponding one of the counters 23a and 23b, a digital-to-analog converter and the like. The content of the RAM is set by the CPU 26, prior to the start of detection. Peak detecting circuits 42a and 42b are provided, each of which comprises a peak hold circuit, an analog-to-digital converter, a RAM and the like. Each of the peak detecting circuits 42a and 42b detects the peak of the pulse signal in response to arrive of the same signal, as in the case of the threshold setting circuits 45a and 45b. When the peak of the pulse signal is detected, the peak value is stored into the RAM after it is converted into a digital signal.

For the four MW-line signals (PW1-PW4) and thus for the four intervals S1-S4, the threshold setting circuit 45a is arranged to set respective threshold voltages independently from each other, whereas the peak detecting circuit 42a is arranged to detect the maximum values of the signal peaks in the four periods S1-S4. On the other hand, for the two MD-line signals (PM1 and PM2) and thus for two periods S5 and S6 shown at a portion (h) of FIG. 10, the threshold setting circuit 45b sets respective threshold voltages independently from each other, while the peak detecting circuit 42b detects the maximum values of the signal peaks in the two periods S5 and S6.

Prior to the start of detection, the CPU 26 first writes appropriate values for the threshold voltages into the RAMs of the threshold setting circuits 45a and 45b, respectively. Also, the CPU 26 sets, in the timing generating circuit 52 and the counters 50 and 51, values for determining a sufficient time period PD (which in turn determines the time periods S1-S4) for picking up the mark signals w1-w4 from the wafer 3 in consideration of the moving precision of the wafer stage 4. Subsequently, when the laser beam on path L scans the mask 1 and the wafer 3, each of the comparators 21a and 21b compares the MW-line signal from the photoelectric detector 14L (14R) or the MD-line signal from the photoelectric detector 16L (16R) with the threshold voltage Vth outputted from corresponding one of the threshold setting circuits 45a and 45b. When the threshold voltage Vth is exceeded, a mark detection signal PM1, PM2, PW1, PW2, PW3 or PW4 of high level is produced. Each of the counters 23a and 23b is operated each time a mark pattern detection signal is produced, and renews the address of the RAM of a corresponding one of the peak detecting circuits 42a and 42b at a moment corresponding to the falling edge of the mark pattern detection signal. For this reason, in the address of the RAM of each of the peak detecting circuits 42a and 42b, the levels (peak values) of the signals from a corresponding one of the detectors 14L (14R) and 16L (16R), corresponding to the respective periods S1-S6, are stored in the form of digital data. Hereinafter, the above-described detection will be referred to also as "preparatory detection". Subsequently, the CPU 26 calculates values to be set in the threshold voltage setting circuits 45a and 45b, on the basis of the results of detection at the peak detecting circuits 42a and 42b with respect to the periods S1-S6, thereby to set the threshold voltage having a predetermined ratio relative to the peak. The values obtained by calculation are set in the RAMs of the circuits 45a and 45b, respectively. Then, by use of MW-line and MD-line signals produced during the next scanning operation, primary detection of the alignment marks is effected. That is, the positions of the mark signals are detected in the manner described hereinbefore, and the relative position of the mask 1 and the wafer 3 is adjusted so as to bring them into alignment. Also, during such operation, the threshold setting circuits 45a and 45b set in the comparators 21a and 21b threshold values defined respectively for the periods S1-S6.

In the alignment device of the type described hereinbefore, the renewing of the address of each of the memories 44a and 44b is effected in response to the mark signal. It is therefore necessary to accurately detect the signals from the mark patterns M1, M2 and W1-W4. For the MW-line signals, however, it is possible that the portion of the wafer surface other than the mark patterns W1-W4 produces signals of different levels due to the existence of the photosensitive layer or the aluminum coating on the wafer 3 surface. So, it is possible that a noise signal n shown in the portion (b) of FIG. 10 is produced from a wafer surface portion other than the mark patterns W1-W4. Additionally, it is possible that a signal denoted by m' in the portion (b) of FIG. 10 corresponding to a mark pattern M' which has been transferred onto the wafer during the preceding exposure operation is produced in the signal train. If such signals are contained in the signal train, it is necessary to discriminate the signals corresponding to the mark patterns W1-W4 from the signals not corresponding to the mark patterns.

Figure 15:
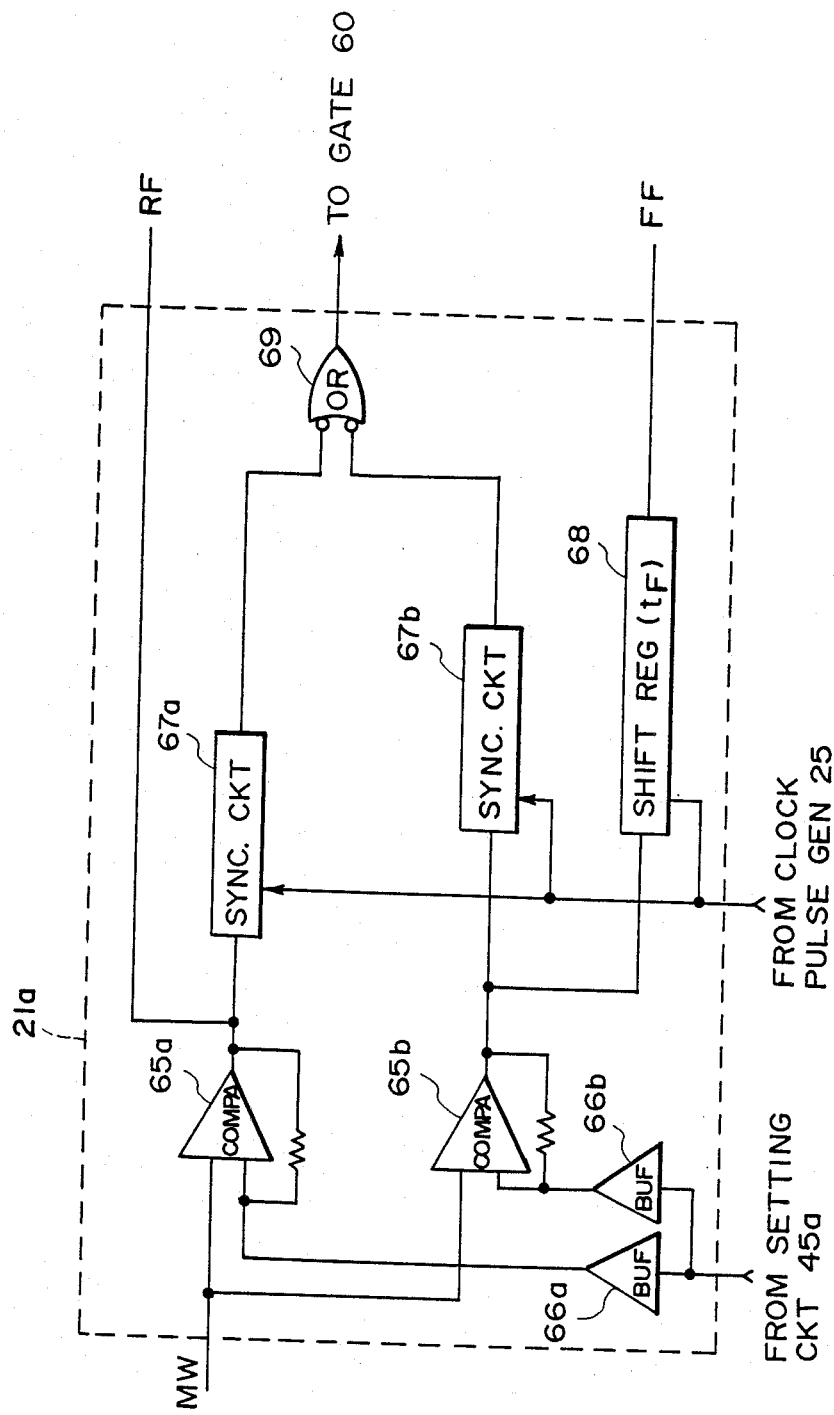
FIG. 15 is a block diagram showing an example of a binarizing circuit used in the embodiment of FIG. 14.

Details of the measurement of the pulse spacing (twn) which is one of the features of the present invention, will now be described in respect to the MW-line signal, for example. In the foregoing part of the Specification, each of the binarizing circuits 21a and 21b has been described simply as a comparator. This is only for the sake of convenience. And, in the following part of the Specification, they will be described as the binarizing circuits having arrangements such as shown in FIG. 15. Details of the structure will be described later.

Figure 11:
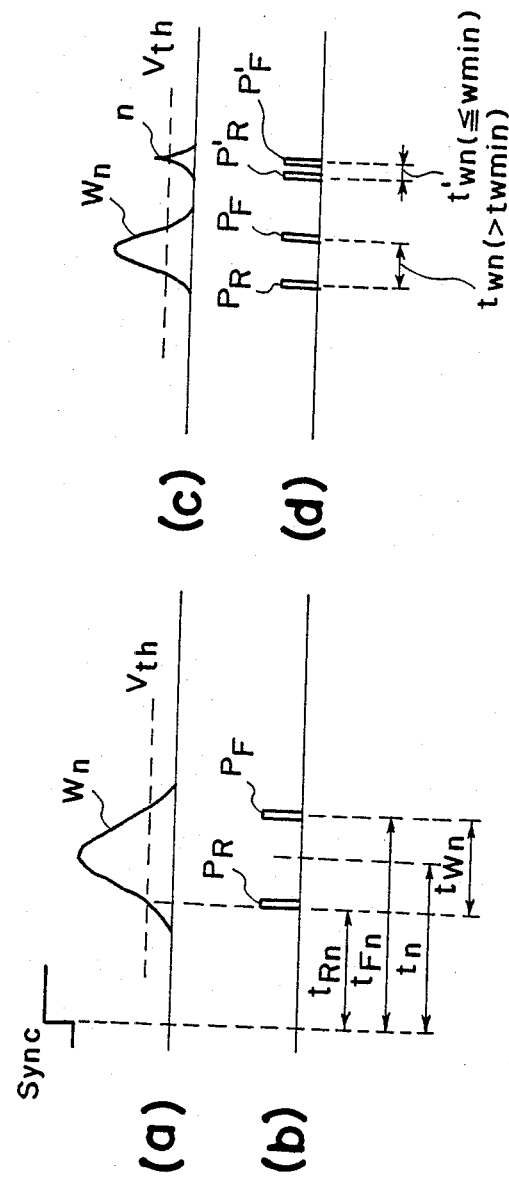
FIG. 11 is an explicative view showing signal processing operations in the FIG. 9 embodiment and in accordance with the detection timing shown in FIG. 10.

Referring now to FIG. 11, when a signal Wn such as shown in a portion (a) of FIG. 11 is produced in the MW-line signal, the binarizing circuit 21a produces two pulses $P_{Rn}$ and $P_{Fn}$ at a moment at which the level of the signal Wn exceeds the threshold voltage Vth and at a moment at which the level of the signal Wn comes lower than the threshold voltage Vth. Each of these pulses has the same width as of the measuring clock in the counter 23a, for example. And, from the times $t_{Rn}$ and $t_{Fn}$ of occurrence of the pulses $P_{Rn}$ and $P_{Fn}$ with reference to the generation of the synchronization signal Sync, the pulse position Pn of the signal Wn is detected by calculation, i.e., $t_n = (t_{Rn} + t_{Fn})/2$.

In the present embodiment, the CPU 26 calculates the pulse spacing $t_{wn}$ ($= t_{Fn} - t_{Rn}$), prior to the calculation of the pulse position tn. The value of $t_{wn}$ corresponds to the width of the signal Wn when it is binarized. The pulse spacing $t_{wn}$ is compared with a minimum spacing twmin which has been preparatorily set for the mark patterns W1-W4 of the wafer 3, by prediction on the basis of the laser beam diameter, the width of the mark pattern of the wafer alignment mark and the like. And, only such a signal as having the pulse spacing $t_{wn}$ which is greater than the minimum spacing $t_{wmin}$ is taken up and the pulse position tn for such signal is stored into the memory of the CPU 26 in the form of the data on $t_{Rn}$ and $t_{Fn}$. Distinctions between the mark signal Wn and the noise signal n will be seen by reference to portions (c) and (d) of FIG. 11.

Next, the CPU 26 examines the spacings between the wafer alignment mark signals Wn, by reference to the pulse positions tn stored into the memory thereof. First, "tk2 − tk1" in respect to the second-detecting one and the first-detected one of the MW-line signals is calculated. The result of calculation is compared with a constant value Ts which is determined by the distance Lsl between the mark patterns W1 and W2 (W3 and W4), the scanning speed of the laser beam L and the frequency of the measuring clocks from the oscillator 25 shown in FIG. 9. This comparison is made by examining the relation between the detected value tn for the "n-th" pulse and the detected value t(n.1) for the next pulse, while setting a tolerance of a certain proportion to the value Ts. That is, the comparison is made by discriminating whether or not the following relation is satisfied:

$$0.95 \cdot T_s < t_{n+1} - t_n < 1.05 \cdot T_s$$

If the above relation is not satisfied, the signal being examined is discriminated as not being the signal from any of the mark patterns W1–W4 of the wafer 3. And, similar examination is made on a value $t(n+2) - tn$.

The above-described examination is made on the assumption that the "n-th" pulse (having a pulse position tn) is defined by a signal corresponding to one of the mark patterns W1–W4 of the wafer 3. If the above-described examination is continued up to the "m-th" pulse and if the relation $$tm - tn > 1.05 \cdot T_s$$

is still held, then it is discriminated that the signal having the position tn is not one corresponding to any of the mark patterns of the wafer 3. Then, an assumption is made again, taking the "(n+1)−th" pulse as being the signal from one of the mark patterns of the wafer 3, and similar examination is made on "$t_{(n+2)} - t_{(n+1)}$", "$t_{(n+3)} - t_{(n+1)}$", . . . "$t_m - t_{(n+1)}$".

In this manner, any signal not corresponding to the mark patterns W1–W4, for example, signals m" which correspond to the mask mark patterns M′1 and M′2 having been printed on the wafer during the preceding exposure operation, signals m from the patterns M1 and M2 of the mask 1, the noise signal n (i.e. Pn), etc., are all excluded from the MW-line signals. By this, only the signals PW1–PW4 shown in the portion (f) of FIG. 10 which correspond to the mark patterns W1–W4 of the wafer 3 are extracted and detected.

The MD-line signal from the mask 1 has a high signal level and a good S/N ratio, as compared with the MW-line signal from the wafer 3. So, detection of the positions of the mark patterns M1 and M2 of the mask 1 is effected by extracting signals m1 and m2 out of the MD-line signal, in the periods of S5 and S6 shown in the portion (h) of FIG. 10.

From the results of detection of the alignment marks M and W of the wafer 3 and the mask 1, the CPU 26 calculates the relative positional deviation between the wafer 3 and the mask 1 and drives at least one of the motors 30–33 shown in FIG. 5, thereby to adjust the relative position of the wafer 3 and the mask 1.

Figure 12:
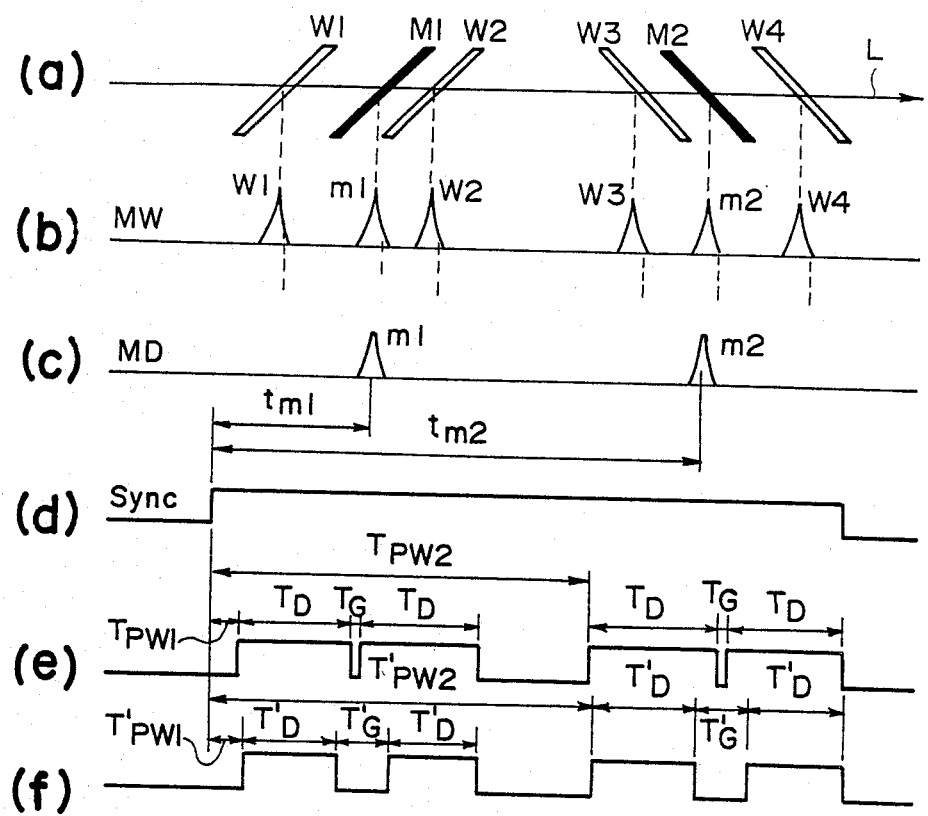
FIG. 12 is an explicative view showing detection signals for alignment marks of a mask and a wafer in the case of the FIG. 9 embodiment, and showing another example of the timing for detecting mark signals, which is different from the FIG. 10 example.

After completion of the drive of the motors, the CPU 26 effects again the above-described detecting operation, for the sake of confirmation as to whether the relative positional deviation between the wafer 3 and the mask 1 is within a predetermined tolerance. If within the tolerance, the position adjustment is finished. Then, on the basis of the positions tm1 and tm2 of the mark patterns of the mask 1, shown in a portion (c) of FIG. 12 and detected during the last-effected detection for the sake of confirmation, the CPU 26 calculates new pre-window times $T'_{pw1}$, $T'_{pw2}$ and $T'_G$.

Figure 13:
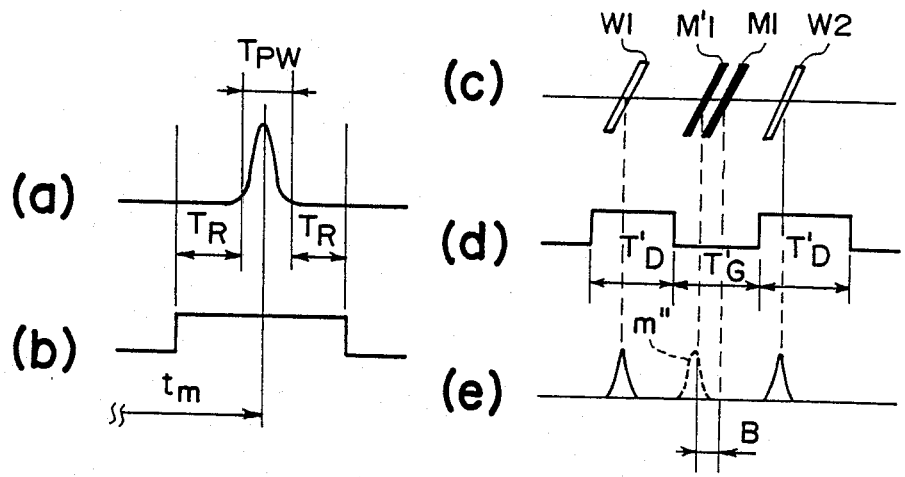
FIG. 13 is an explicative view showing signal processing operations in the FIG. 9 embodiment and in accordance with the detection timing shown in FIG. 12.

This calculation is made in the following manner:

The alignment device of this embodiment is arranged such that the wafer 3 is displaced in a case where the relative positional deviation between the wafer 3 and the mask 1 is greater than a predetermined value "A", while the mask 1 is displaced in a case where the positional deviation is not greater than the predetermined value "A". As shown in FIG. 13, it is now assumed that a time period corresponding to the maximum displacement "A" of the mask 1 in the mark pattern signal detecting system is denoted by $T_R$, that an expected value for the maximum width of the signal from the mark pattern M1 or M2 of the mask 1 is denoted by $T_{pw}$, and that a time period corresponding to the error in the movement of the wafer stage 4 for moving the wafer 3 from a current-shot-area exposing position to a next-shot-area exposing position is denoted by $T'_D$. Then, the CPU 26 effects the following calculations:

$$T_G = T_{pw} + 2T_R$$

$$T'_{pw1} = tm1 - T'_D - \tfrac{1}{2} T'_G$$

$$T'_{pw2} = tm2 - T'_D - \tfrac{1}{2} T'_G$$

wherein $T_{pw} + 2T_R << LS1$.

The values of $T'_{pw1}$, $T'_{pw2}$ and $T'_G$ detected by the calculations are set in the counter 50 and the timing generating circuit 52 shown in FIG. 9.

For the maximum displacement "A" of the mask 1, a value greater than the value "B" for the amount of error in the movement of the wafer stage 4 is selected. If, for example, a mark pattern M′1 of a mask used in the preceding manufacturing process has been transferred onto the wafer 3, such as shown in a portion (c) of FIG. 13, a signal m″ from the transferred image of the pattern M′1 is produced at a time during the time period $T'_G$, such as shown in a portion (e) of FIG. 13. Thus, it is not contained or mixed into the MW-line signal. If, therefore, the alignment is once attained with respect to one of the shot areas on the wafer 3, the MW-line signals from the wafer with respect to each of the remaining or succeeding shot areas are all detected during the time periods $T'_D$ shown in the portion (f) of FIG. 12. Thus, there is no possibility that the CPU 26 detects the signal m″ shown in the portion (e) of FIG. 13 even if the mark pattern M′1 having been transferred during the preceding manufacturing process exists on the wafer 13 surface. For this reason, the number of repetitions of the above-described signal extracting operation can be reduced. As a result, the alignment is attainable with substantially the same processing speed as in the case of alignment without the signal extracting operation.

Another embodiment of the present invention will now be described with reference to FIG. 14. In this embodiment, the manner of extracting, out of the MD-line signals and the MW-line signals, the signals corresponding to the mark patterns M1, M2 and W1–W4 is different from that in the foregoing embodiment. First, the binarizing circuit 21a (21b) used in this embodiment will now be described in detail, by reference to FIG. 15.

In FIG. 15, the MW-line signal corresponding to the wafer 3 is inputted into each of comparators 65a and 65b. As for reference voltages for the comparators 65a and 65b, a threshold voltage outputted from the threshold setting circuit 45a is supplied by way of buffers 66a and 66b, respectively. In each of the comparators 65a and 65b, a hysteresis of an order of approx. 0.1 V is set.

Figure 16:
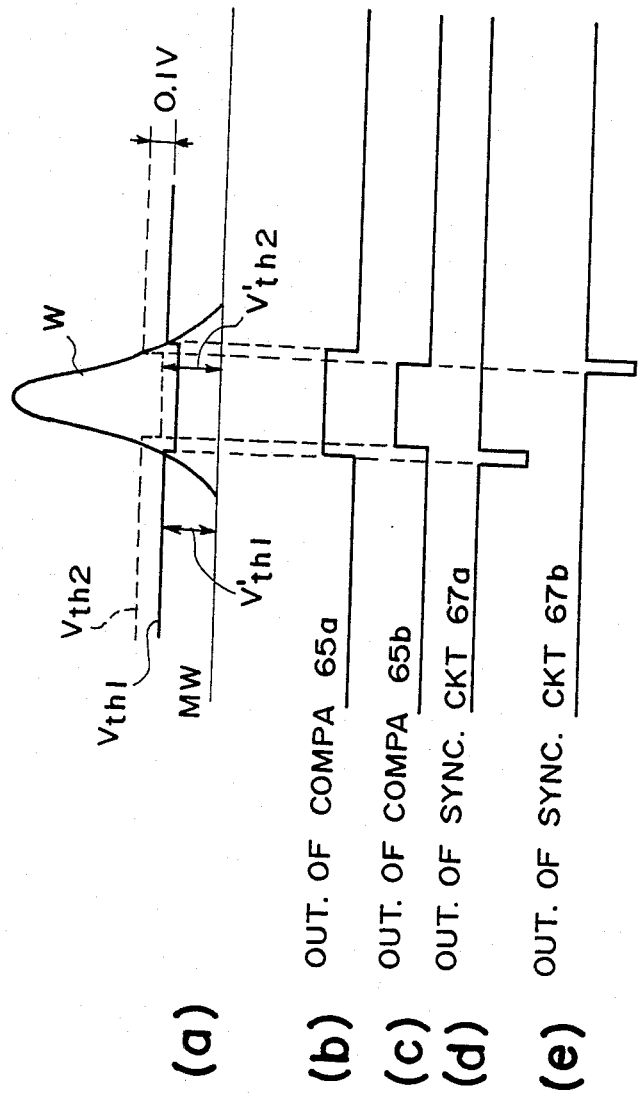
FIG. 16 is a waveform view showing inputs/outputs in the circuit arrangement of FIG. 15.

Also, under the influence of the buffers 66a and 66b, the threshold voltage $V_{th2}$ of the comparator 65b is set, as shown in a portion (a) of FIG. 16, so that it becomes higher by 0.1 V than the threshold voltage $V_{th1}$ of the comparator 65a. When, in this arrangement, a signal W from a mark pattern of the wafer 3 arrives at the binarizing circuit 21a, the threshold voltage $V_{th1}$ of the comparator 65a changes in the manner such as denoted by a solid line in the portion (a) of FIG. 16, and the output of the comparator 65a is such as shown in a portion (b) of this Figure. Also, the threshold voltage $V_{th2}$ of the comparator 65b changes in the manner such as shown by a broken line in the portion (a) of FIG. 16, and the output of the comparator 65b is such as shown in a portion (c) of this Figure. It is seen that the threshold voltage $V'_{th1}$ defined upon change in the comparator 65a from the low level to the high level and the threshold voltage $V'_{th2}$ defined upon change in the comparator 65b from the high level to the low level are substantially equal to each other. The outputs of the comparators 65a and 65b are supplied to synchronization circuits 67a and 67b, respectively. Also, clock pulses are supplied to these synchronization circuits from the clock pulse oscillator 25. The synchronization circuit 67a produces one clock pulse of low level in response to arrival of a rising edge of the input signal (output of the comparator 65a) such as shown in a portion (d) of FIG. 16. The synchronization signal 67b produces one clock pulse of low level in response to a falling edge of an input signal (the output of the comparator 65b) such as shown in a portion (e) of FIG. 16. The outputs of the synchronization circuits 67a and 67b are added to each other in an "or" gate 69, after being inverted, such that they are formed into an output of the binarizing circuit 21a.

The output of the comparator 65a is supplied to the RAM 44a of FIG. 14 as a rise flag RF, while the output of the comparator 65b is supplied to a latch 62 of FIG. 14 as a fall flag FF by way of a shift register 68 which is provided to delay application of the output of the comparator 65b by a time period $t_F$. To the shift register 68, the clock pulses from the oscillator 25 is supplied, as in the cases of the synchronization circuits 67a and 67b. The shift register 68 is adapted to output the signal from the comparator 65b, with a time delay tF which is greater, by "f" times, than the stage number of the frequency of the clock pulses from the oscillator 25. Therefore, the fall flag FF which is the output of the shift register 68 at the time of generation of the output of the synchronization circuit 67b shows the content of the output of the comparator 65b at the time earlier than the first-mentioned time by the time period $t_F$. The other binarizing circuit 21b has substantially the same structure.

As shown in FIG. 14, the outputs of the binarizing circuits 21a and 21b are processed in processing circuits 63 and 64, independently from each other. The processing circuits 63 and 64 have the same structures and provide substantially the same processing operations relative to the signals from the binarizing circuits. For this reason, description will be made only to one (63) of the processing circuits, which one is provided to process the MW-line signals from the binarizing circuit 21a. Elements in FIG. 14 having similar or corresponding functions as of those of the foregoing embodiments are denoted by the same reference numerals.

When, in FIG. 14, a high level output is produced at an "and" gate 60, a latch 62 is actuated to latch an output of a counter 23a at the time corresponding to the rising edge of that high level output. Also, to the latch 62, the fall flag FF which is the output of the shift register 68 of FIG. 15 is inputted. The fall flag FF is also latched, simultaneously with the latching of the output of the counter 23a. In a random access memory 44a (hereinafter "RAM"), the output of the latch 62 is stored with a time delay $t_D$, defined by a delay circuit 61, after the time of generation of the output of the "and" gate 60, i.e. after the time of generation of the pulse signal to be stored into the RAM 44a.

The rise flag RF outputted from the comparator 65a of the binarizing circuit 21a is directly supplied to the RAM 44a and it is stored into the RAM 44a, together with the fall flag FF and the content of counting by the counter 23a at the moment of generation of the output of the "and" gate 60 having been latched in the latch 62, with the time delay $t_D$ after the time of generation of the output of the "and" gate 60 (time of generation of the output of the comparator 65a or 65b). Namely, the output of the comparator 65a at the time which is later than the time of generation of the output of the "and" gate 60 by the time period $t_D$ is stored in the RAM 44a as the rise flag RF.

Figure 17:
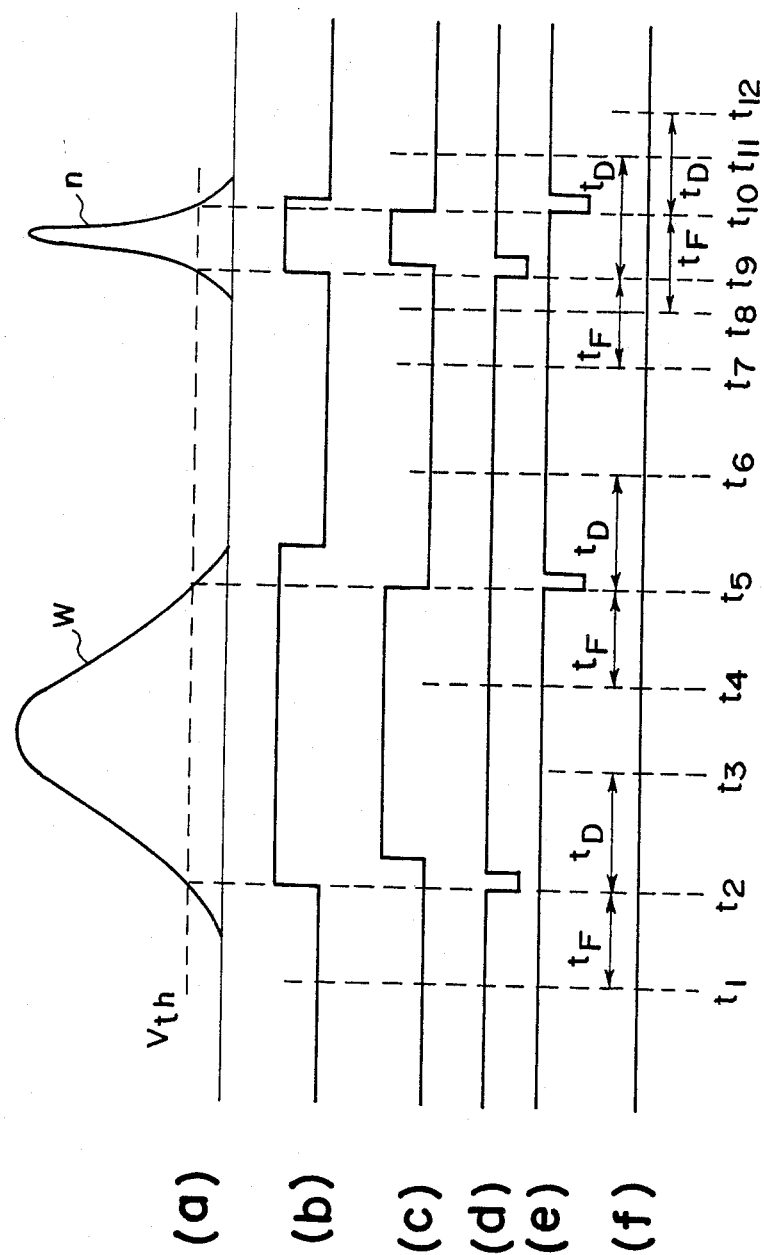
FIG. 17 is a waveform view showing the operation of the embodiment of FIG. 14.

When, in the above-described arrangement, a signal W from one of the mark patterns of the wafer 3 and having a certain signal width such as shown in a portion (a) of FIG. 17 arrives at the binarizing circuit 21a, the comparator 65a produces an output such as shown in the left-hand region of the portion (b) of FIG. 17, while the comparator 65b produces an output such as shown in the left-hand region of the portion (c) of this Figure. The rising edge of the output of the comparator 65a is defined just at the moment at which the level of the signal W increases beyond the threshold voltage Vth, whereas the falling edge of the comparator 65b is defined just at the moment at which the level of the signal W comes lower than the threshold voltage Vth. The synchronization circuit 67a produces a signal such as shown in a portion (e) of this Figure at the moment corresponding to the rising edge of the comparator 65a, while the synchronization circuit 67b produces a signal such as shown in a portion (e) of this Figure at the moment corresponding to the falling edge of the comparator 65b.

Assuming now that the time of generation of the output of the comparator 65a is t2, the content of counting at the counter 23a at the time t2 is stored into the RAM 44a at time t3 which is later than the time t2 by the time period $t_D$, together with the rise flag RF which is the output of the comparator 65a. Simultaneously therewith, the fall flag FF which represents the content of the output of the comparator 65b at time t1 which is earlier than the time t2 (the time of generation of the output of the comparator 65a) by a time period tF, is stored into the RAM 44a. At this time, the rise flag RF=1 and the fall flag FF=0.

When, at time t5, the level of the signal W becomes lower than the threshold voltage Vth, the synchronization circuit 67b produces an output, such that the content of the counter 23a at the time t5 and the fall flag FF depicting the content of the output of the comparator 30 at a time t4 which is earlier than the time t5 by the time period $t_F$ are stored into the RAM 44a at a time t6 which is later than the time t5 by the time period $t_D$, together with the rise flag RF depicting the content of the output of the comparator 65a at the same time t6. At this moment, the rise flag RF=0 and the fall flag FF=1.

Where such a signal n as shown in the portion (a) of FIG. 17 and having a narrower width as compared with the length of each of the time periods $t_F$ and $t_D$ arrives at the binarizing circuit 21a, the output of the comparator 65a is "0" at time t11 later, by the time period $t_D$, than time t9 at which the content of the counter 23a when the level of the signal n increases beyond the threshold voltage Vth (time t9) is to be stored into the RAM 44a. Therefore, a numerical data "0" is stored into the RAM 44a as the rise flag RF. On the other hand, the output of the comparator 65b at time t7 earlier than the time t9 by the time period $t_F$ is also "0". Therefore, a numerical data "0" is stored into the RAM 44a as the fall flag FF. Also, at time t12 (=t10+$t_D$) at which the content of the counter 23a, defined at time t10 at which the level of the signal n came lower than the threshold voltage Vth, is to be stored, the rise flag RF=0. And, the output of the comparator 65b at a time t8 earlier than the time t10 by the time period $t_F$ is also "0". As a result, a numerical data "0" is stored into the RAM 44a as the fall flag FF.

In FIG. 14, the counter 23a is of a 14-bit type, while the RAM 44a is of a 16-bit type. And, such as shown in a portion (a) of FIG. 18, the rise flag RF is stored in the highest bit MSB of the RAM 44a, the fall flag FF is contained in the next bit, and the results of detection of the pulse positions which are the outputs of the counters 23a are contained in the remaining fourteen (14) bits including the lowest bit LSB.

Figure 18:
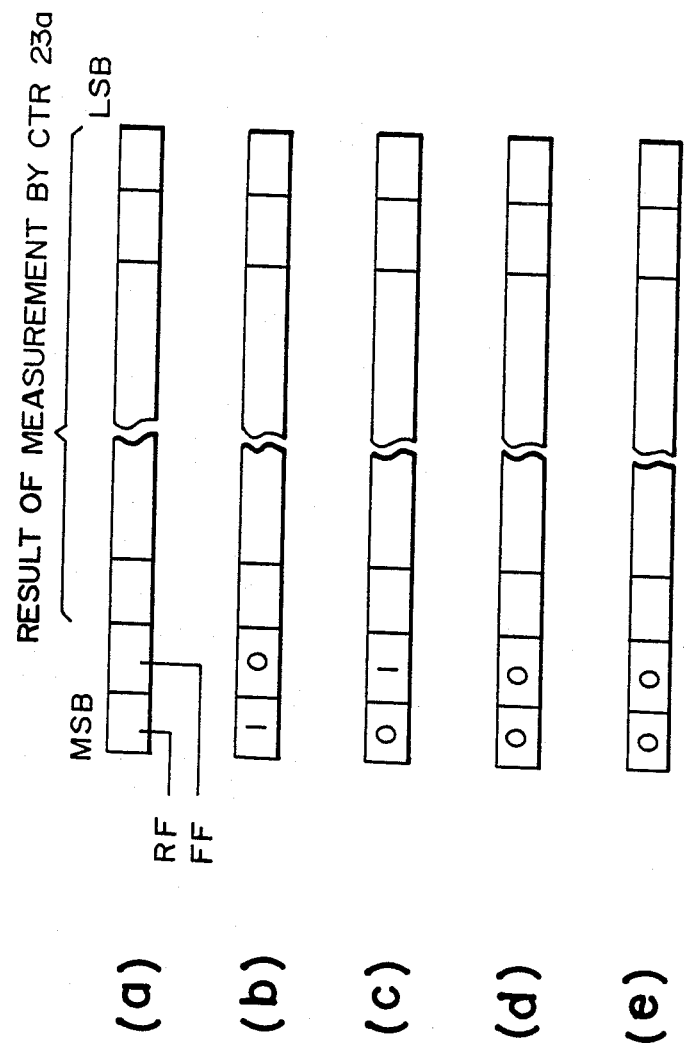
FIG. 18 is a schematic view showing a format for information to be stored, used in the embodiment of FIG. 14.

The bit pattern of the RAM 44a containing the results of detection by the counter 23a at the time t2 shown in the portion (f) of FIG. 17, corresponding to the rise of the signal W is such as shown in the portion (b) of FIG. 18. Also, the bit pattern at the time t5 is such as shown in the portion (c) of FIG. 18, the bit pattern at the time t9 is such as shown in the portion (d), and the bit pattern at the time t10 is such as shown in the portion (e) of this Figure.

Upon reading of the bit pattern of the RAM 44a, the CPU 26 examines the contents of the highest two bits such as shown in FIG. 18. By this, it is possible to promptly discriminate whether the results of measurement by the counter 23a are concerned with a signal from an alignment mark or with a noise signal and the like, and also it is possible to immediately discriminate, for the signal from the alignment mark, whether the result of measurement by the counter 23a are concerned with the rise time of the signal or with the fall time of the signal.

In the present embodiment, as described, only the signals corresponding to the alignment marks can be extracted out of the detection signal. This allows high-accuracy alignment of the mask 1 and the wafer 3.

A further embodiment of the present invention will now be described by reference to FIG. 19. One of the important features of the present embodiment lies in the point that the mode of effecting the extracting operation for the mark signals such as described with reference to the forgoing embodiments can be selected automatically or manually, in view of the conditions of the wafer 3, i.e. the degree of S/N ratio and the magnitude of the pedestal component of the detection signal from the wafer 3. Also in this embodiment, elements having similar or corresponding functions as of those of the foregoing embodiments are denoted by the same reference numerals.

Figure 19:
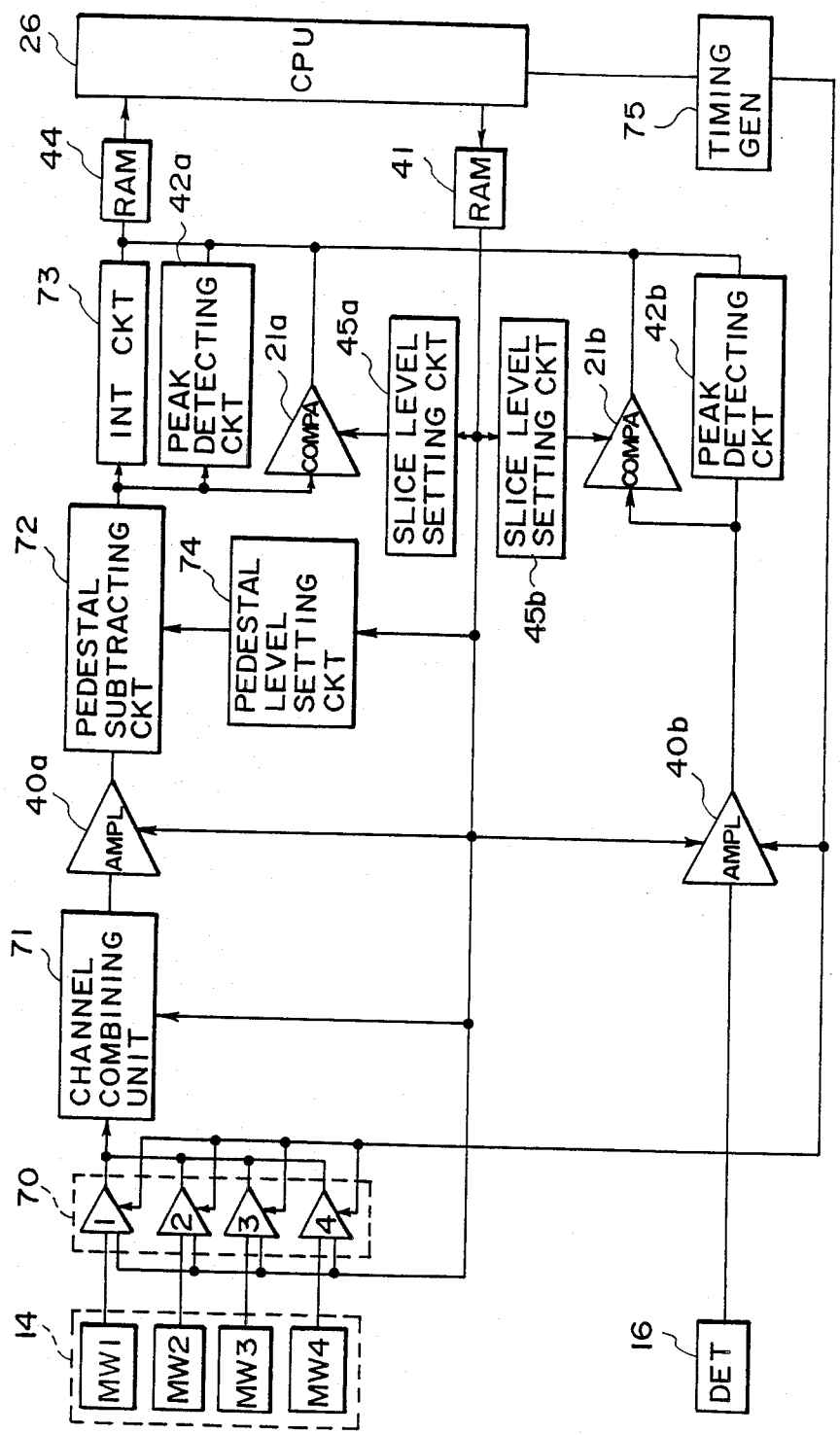
FIG. 19 is a block diagram showing an alignment device according to a further embodiment of the present invention.

In FIG. 19, the scatteringly reflected light from the alignment mark of the wafer 3 is incident on an MW-line photoelectric detector 14 having four detecting portions MW1–MW4. Each of output signals from the detecting portions MW1–MW4 of the detector 14 is amplified in a variable-gain amplifier 70, independently from the others. After passing through a channel combining unit 71 which is operative in response to selection signals supplied thereto from the CPU 26, the output signal of the photoelectric detector 14 is amplified again by another variable-gain amplifier 40a. The CPU 26 writes, into a RAM 41, such a gain that is effective to provide MW-line signals of suitable level. The gain of each of the variable-gain amplifiers 70 and 40a is controlled in accordance with the output of the RAM 41. Also, the RAM 41 stores therein the data about the slice level and the pedestal level, outputted from the CPU 26.

Figure 20:
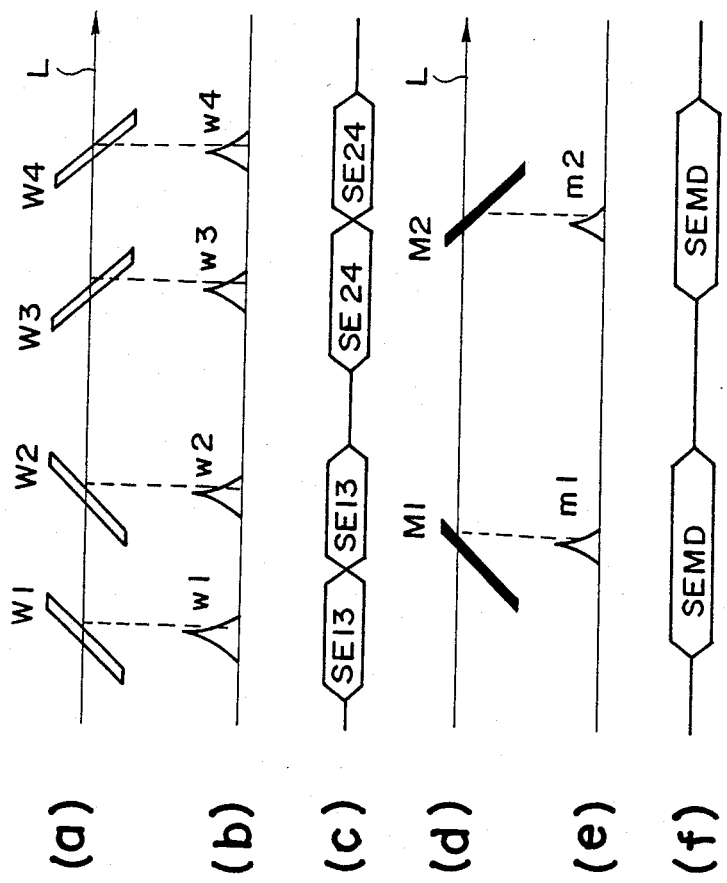
FIG. 20 is an explicative view showing detection signals for a mask and a wafer in the embodiment of FIG. 19, and showing the timing for detecting mark signals.

The CPU 26 sets, relative to a timing generating circuit 75, time periods allowing gating respectively for the MW-line signals shown in a portion (b) of FIG. 20, with reference to the rise of a synchronization signal Sync being taken as a reference, and produces a timing such as shown in a portion (c) of FIG. 20. Also at the same timing, the CPU 26 supplies to the variable-gain amplifier 70 such detector selecting signals SE13 and SE24 as shown in the portion (c) of FIG. 20, so as to control enabling/disenabling for the outputs of the elements of the variable-gain amplifier 70.

In the portion (c) of FIG. 20, when the selection signal SE13 is outputted, each of the outputs of the detectors MW1 and MW3 is enabled. When the selection signal SE24 is outputted, each of the outputs of the detectors MW2 and MW4 is enabled. The setting of time from the CPU 26 is presettable.

Referring back to FIG. 19, a pedestal level setting circuit 74 is adapted to apply to a pedestal subtracting circuit 72 an output of the RAM 41 after converting it into an analog signal. In the pedestal subtracting circuit 72, the output of the pedestal setting circuit 74 is subtracted from a signal having been amplified by the variable-gain amplifier 40a.

Figure 21:
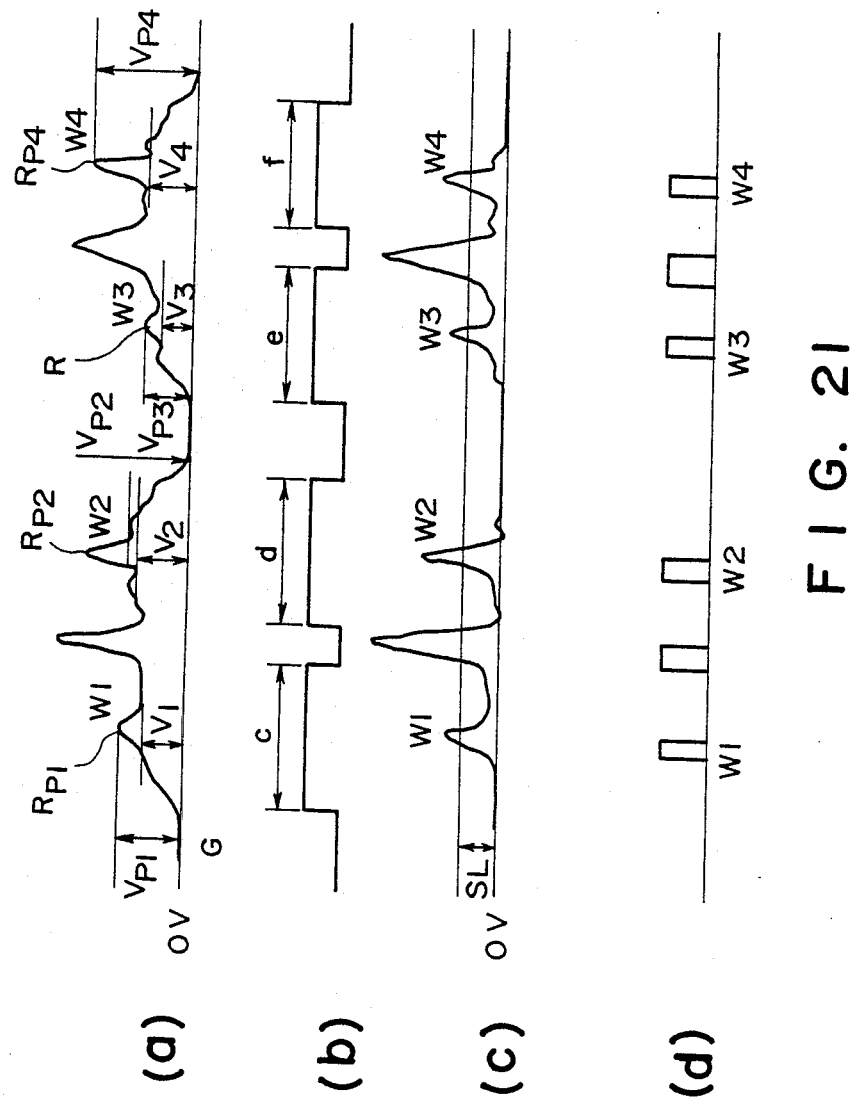
FIG. 21 is an explicative view showing a pulse detecting operation to be effected relative to a detection signal having a large pedestal component, in the embodiment of FIG. 19.

The CPU 26 is also arranged to cause, under the control of a timer, the timing generating circuit 75 to produce timing signals c - f shown in a portion (b) of FIG. 21. For each of the periods of these timing signals c - f, an integrated circuit 73 effects integration and the values obtained by the integration, after they are converted into digital data, are stored into a RAM 44 provided for the sake of fetching of the peaks of the pedestal level.

A peak detecting circuit 42a is provided to detect peaks of the signals during the periods of the timing signals c - f, respectively, the detected peaks being stored into the RAM 44 after they are converted into digital data.

A slice level setting circuit 45a is provided to convert the data, stored in the RAM 41 by the CPU 26, into an analog data and thus, sets a corresponding threshold voltage in a binarizing circuit (comparator) 21a.

The scatteringly reflected light from the alignment mark of the mask 1 enters into an MD-line photoelectric detector 16, and an output signal therefrom is amplified by a variable-gain amplifier 40b whose gain is controlled by the CPU 26. A peak detecting circuit 42b, a binarizing circuit (comparator) 21b and a slice level setting circuit 45b all have similar functions as of those of corresponding components in the MW-line detecting system.

The timing signals for the MD-line signals are produced from the timing generating circuit 75, independently from those for the MW-line signals, in accordance with the time setting which is made with reference to the rise of the synchronization signal Syns of the CPU 26, such as shown in the portion (f) of FIG. 20. For these time periods, selection signals SEMD are supplied to the variable gain amplifier 40b from the CPU 26.

In this embodiment, after a predetermined shot area of the wafer 3 is moved to a position under the projection lens system 5, the alignment marks of the mask and the wafer are scanned by a laser beam along path L. And, detection of peak levels in the MD-line signal outputted from the MD-line photoelectric detector 16 in accordance with the laser beam scanning, is effected by the MD-line peak detecting circuit 42b. On the basis of the thus detected peak level, the CPU 26 sets in the RAM 41 the values of the gain and the slice level which are effective to cause the variable-gain amplifier 40b to produce output signals of suitable level, which is of an order of 1.6–2.4 V. Thereafter, the laser beam scanning is effected again and the MD-line signals are detected again. And, by use of a pulse spacing measuring circuit 23b, the positions of the mark patterns of the alignment marks formed on the mask 1 are detected. The detection of the peak level for the MD-line signals from the photoelectric detector 14 is effected by the peak detecting circuit 42a.

As for the outputs of the integrating circuit 73, values V1–V4 such as shown in a portion (a) of FIG. 21 which correspond respectively to the base lines (pedestals) G of the signals in the integration periods c - f are produced. Also, as for the outputs of the peak detecting circuit 42a, maximum peaks $V_{p1}-V_{p4}$ in the respective periods c–f such as shown in a portion (b) of FIG. 21, which are determined by the timing generating circuit 75, are obtained.

The CPU 26 calculates real peaks $R_{p1}-R_{p4}$ by subtracting the pedestal components from the maximum peaks for the respective periods c - f. And, on the basis of the thus obtained real peaks $R_{p1}-R_{p4}$, the CPU 26 sets in the RAM 41 the values of the gain and the slice level that are effective to provide real peaks of desirable level. Further, with respect to the levels of the pedestal subtraction for the respective time periods c - f, the CPU 26 sets in the RAM 41 new levels for pedestal subtraction which are obtainable from the real peaks detected at the newly set gain and from the currently-set levels for pedestal subtraction. As shown in the portion (c) of FIG. 20, during the subsequent MW-line signal detecting operation, MW-signals with their pedestal components being subtracted are produced from the pedestal subtracting circuit 72.

In this manner, the MW-line signals from the alignment marks of the wafer 3 can be amplified while avoiding an unpreferable increase in the level of the base line or pedestal in the signals due to the irregularity in the surface of the wafer 3, such as for example the roughness of the aluminum coating on the wafer 3 surface. And, for such wafer providing a low signal level and a large pedestal, or for such a wafer as providing uneven pedestal due to the irregular reflection of the light from a rough surface such as the surface of the aluminum coating, only the mark pattern signals can be amplified by a large amount.

After the amplification, the MW-line signals shown in the portion (c) of FIG. 21 are binarized at a slice level set in the RAM 41, whereby a pulse train such as shown in the portion (d) of FIG. 21 is obtained. From this pulse train and by use of the pulse spacing measuring circuit 23a, the CPU 26 detects the positions of the alignment marks.

Figure 22:
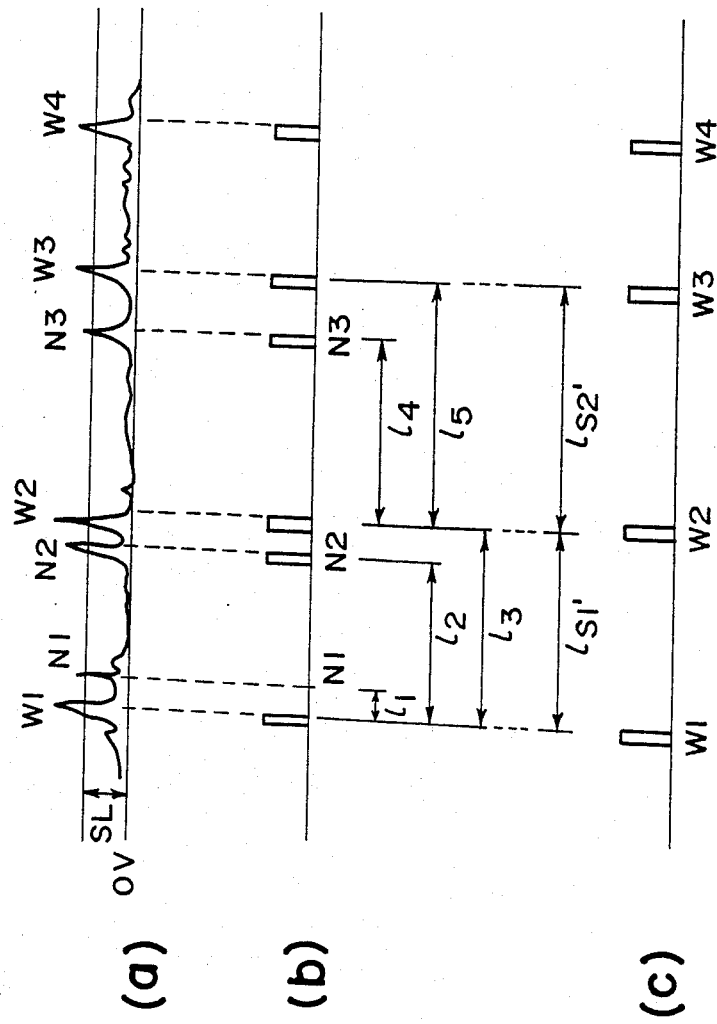
FIG. 22 is an explicative view showing a pulse detecting operation to be effected relative to a detection signal having a low S/N ratio, in the embodiment of FIG. 19.

In a case of a wafer alignment mark which provides a low S/N ratio, the MW-line signal from the variable-gain amplifier 40a is such as shown in a portion (a) of FIG. 22. When such MW-line signal is binarized at a certain slice level SL determined by the slice level setting circuit 45a, the pulse train obtained by the binarization is such as shown in a portion (b) of FIG. 22. That is, by the effect of noise, pulses N1–N3 are mixedly contained in the MW-line signal, which causes an error in the measurement of the pulse spacing. In consideration thereof, in the embodiment of FIG. 19, the alignment device is provided with a function of signal extraction, such as described in the foregoing, for searching only four real signal pulses W1–W4 shown in a portion (c) of FIG. 22, in order that any signal or signals other than those from the alignment mark are excluded. Hereinafter, such signal extracting function will be referred to also as "pulse search routine".

The distances between the mark patterns of the alignment mark of the wafer 3 are constant. In the pulse search routine, the values corresponding to the distances or spacings LS1 and LS2 shown in the portion (a) of FIG. 10 with certain tolerances are used as reference lengths ls1' and ls2' such as shown in a portion (c) of FIG. 22. And, after the first pulse W1 is detected, any pulse which satisfies the reference length ls1' from the position of the first pulse W1 is detected as a second real signal W2. A pulse N1 having a distance l1 from the first pulse W1 and a pulse N2 having a distance l2 from the same pulse W1 are excluded or disregarded. Then, any pulse satisfying the second reference length ls2' from the position of the second pulse 2 is detected as a third real signal. A pulse N3 having a distance l4 from the second pulse W2 is excluded. For the detection of a fourth pulse, the reference length ls1' is used.

Each of the signals from the mark patterns of the alignment mark of the wafer 3, has a certain pulse width. In consideration thereof, the alignment device of the present embodiment is provided also with a function of excluding a linear pulse such as a pulse N1 shown in the portion (a) of FIG. 22, by discriminating whether a pulse being examined has a width not less than a predetermined value. In this manner, the signals W1–W4 from the mark patterns can be accurately detected, even if false signal components or noise components are contained in the MW-line signal. The last-mentioned portion of the present embodiment is essentially the same as that described in detail with reference to the foregoing embodiments.

Referring now to a flow chart of FIG. 23A, a first example of the operation of the alignment system of the present embodiment will be described.

In response to start of the alignment operation (Step 101), the detecting operation for detecting the peak values is repeatedly effected (Step 102) by a desired number of repetitions which are preparatorily set. Simultaneously therewith, the pedestal components of respective time periods are detected by use of the pedestal integrating circuit 73 of FIG. 19, the results of integration being stored into the RAM 44 shown in FIG. 19. Similarly, the information about the number of pulses in the pulse train which are to be obtained by binarizing analog electric signals corresponding to the mark patterns M1, M2 and W1–W4, in the windows shown in the portions (c) and (f) of FIG. 20 defined for the sake of gating of the electric signals, are stored in the RAM 44 of FIG. 19, in relation to each of the MDL-line, MDR-line, MWL-line and MWR-line (see FIG. 5).

At Step 103, the result of integration for the detected pedestal component and the number of detected peaks, i.e. the number of pulses in the train, are examined. If the value obtained by the integration of the detected pedestal component is not less than a predetermined value, a "bad" mode including the pedestal subtracting routine (Step 107) is selected. If the number of detected pulses is not less than the predetermined number, it is discriminated that the MW-line signal (MD-line signal) has a low S/N ratio. So, a "middle" mode including the pulse search routine (Step 109) is selected. For a wafer such as a $SiO_2$ wafer usually allowing detection of the MW-line signals at a relatively stable level, a "good" mode is selected.

In the "bad" mode, for example, the result of integration is read out (Step 104) and the real peaks $R_{P1}$–$R_{P4}$ in the time periods such as shown in the portion (a) of FIG. 21 are calculated. Subsequently, at Step 105, a new gain is set so as to provide real peaks of suitable peak level, of an order of 1.6–2.4 V. Then, at Step 106, a slice level for the peaks as amplified by the new gain is calculated. And, at Step 107, the level of pedestal component, as amplified by the new gain, is calculated. The value obtained by calculation is set as a new pedestal subtracting level. Thereafter, at Step 108, the pulse spacings are measured in the manner described hereinbefore and, at Step 109, the mark pattern signals are searched in accordance with the pulse search routine. At Step 110, the relative positional deviation between the alignment marks of the mask 1 and the wafer 3 is measured on the basis of the mark pattern signals detected by the pulse search routine. Then, at Step 111, whether or not the detected positional deviation is within the tolerance or not discriminated. If within the tolerance, the sequence proceeds to Step 113, whereby the alignment operation is completed. If not within the tolerance, the sequence goes to Step 112, so that the mask stage 2 and/or the wafer stage 4 are moved by an amount correcting the positional deviation. Thereafter, the sequence goes back to Step 108.

To carry out all the operations in the "bad" mode relative to every one of the wafers including those from which substantially no pedestal component is produced or those providing a high S/N ratio, leads to an unnecessary reduction in the throughput of the apparatus. For this reason, in the "middle" mode, the calculation of the real peaks at Step 104, the subtraction of the pedestal level at Step 107 and the pulse searching operation at Step 109 are omitted, thus attaining further increase in the speed of position detecting operation.

The selection of mode in accordance with the material or the conditions of the wafer surface allows avoidance of ineffective loop, thereby to assure high-speed alignment while attaining high accuracy in the alignment.

The signal processing operation in another aspect of the present embodiment will now be described with reference to a flow chart of FIG. 23B. The major distinction of this example over the example of FIG. 23A lies in that the discrimination of the material of the wafer, i.e. the surface conditions of the wafer, is effected on the basis of information supplied from an unshown console in accordance with the designation made by the operator. Namely, in the flow of FIG. 23B, discrimination of the material of the wafer is made manually, as compared with the automatic discrimination in the flow of FIG. 23A.

Figure 23B:
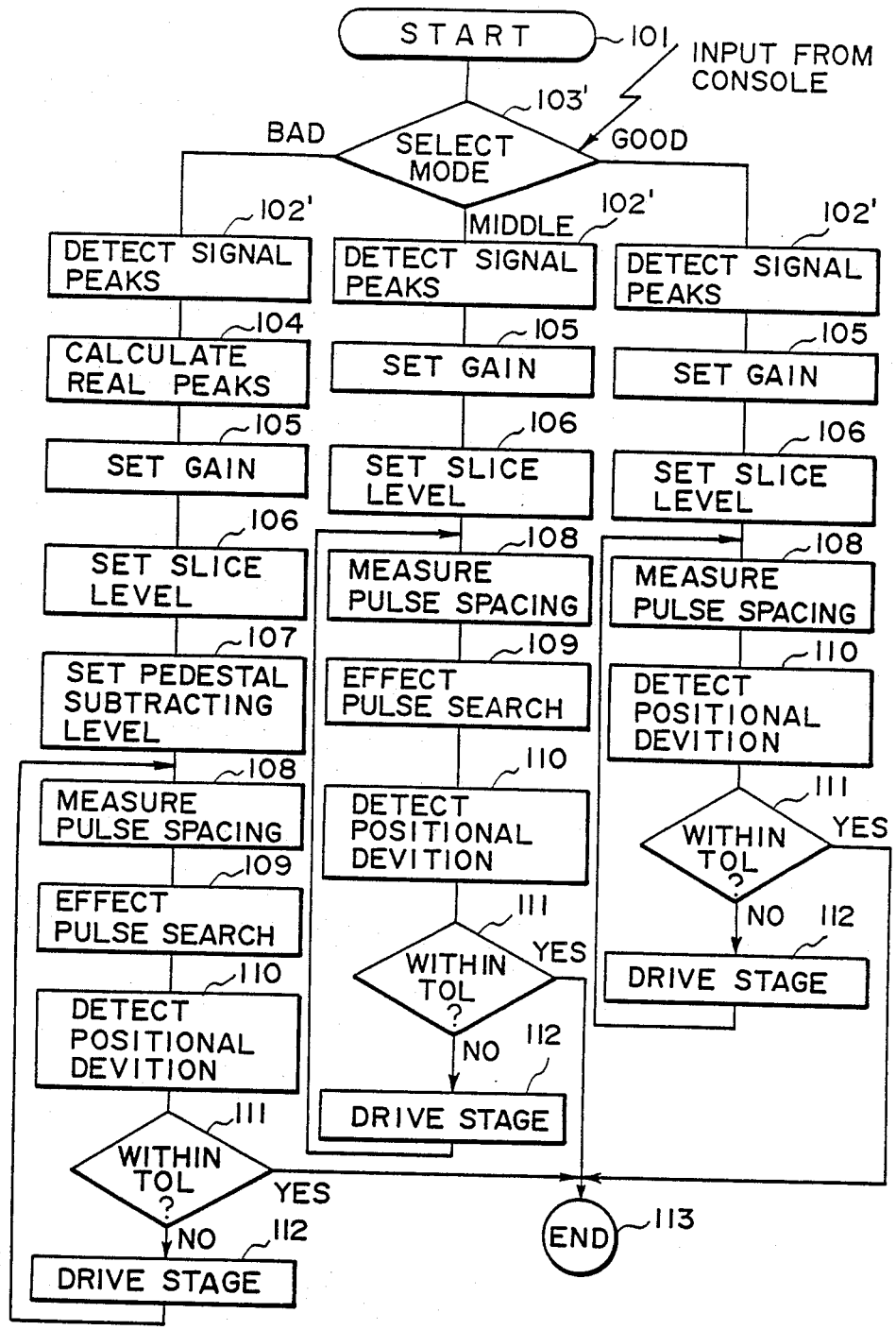
FIG. 23B is a flow chart showing another aspect of the operation of the alignment device according to the FIG. 19 embodiment.

Referring to FIG. 23B in response to start of the alignment operation at Step 101, the material of the wafer being processed is discriminated on the basis of an instruction signal selected in accordance with an input at the console (Step 103'). In accordance with the result of such discrimination, one of the position detecting modes is selected. That is, for a wafer having a rough surface or producing a large pedestal component, a "bad" mode including a pedestal subtracting routine (Step 107) is selected. For a wafer from which a signal of low S/N ratio is liable to be produced so that there is a high possibility of inclusion of false signals, a "middle" mode having a pulse search routine (Step 109) is selected. For a wafer such as a $SiO_2$ wafer for which detection of the MW-line signals is attainable with a relatively stable level, a "good" mode is selected.

In the "bad" mode, for example, detection of the peak values is repeatedly effected (Step 102') by a desired number of repetitions which has been preset. After detection of the peak values, an average thereof is calculated.

The operations following step 102' in the "bad" mode are the same as those shown in FIG. 23A. This is also the case with the "middle" mode and the "good" mode. Therefore, description of the remaining portion will be omitted here only for the sake of simplicity.

Figure 2:
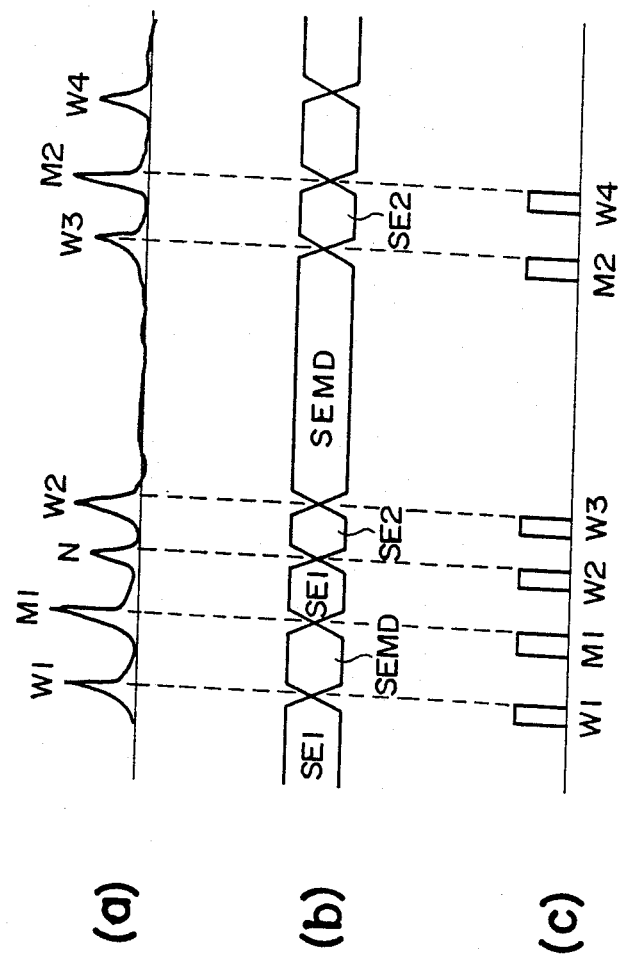
FIG. 2 is an explicative view showing an example of a detection signal having a low S/N ratio and the timing for detecting mark signals.
Figure 3:
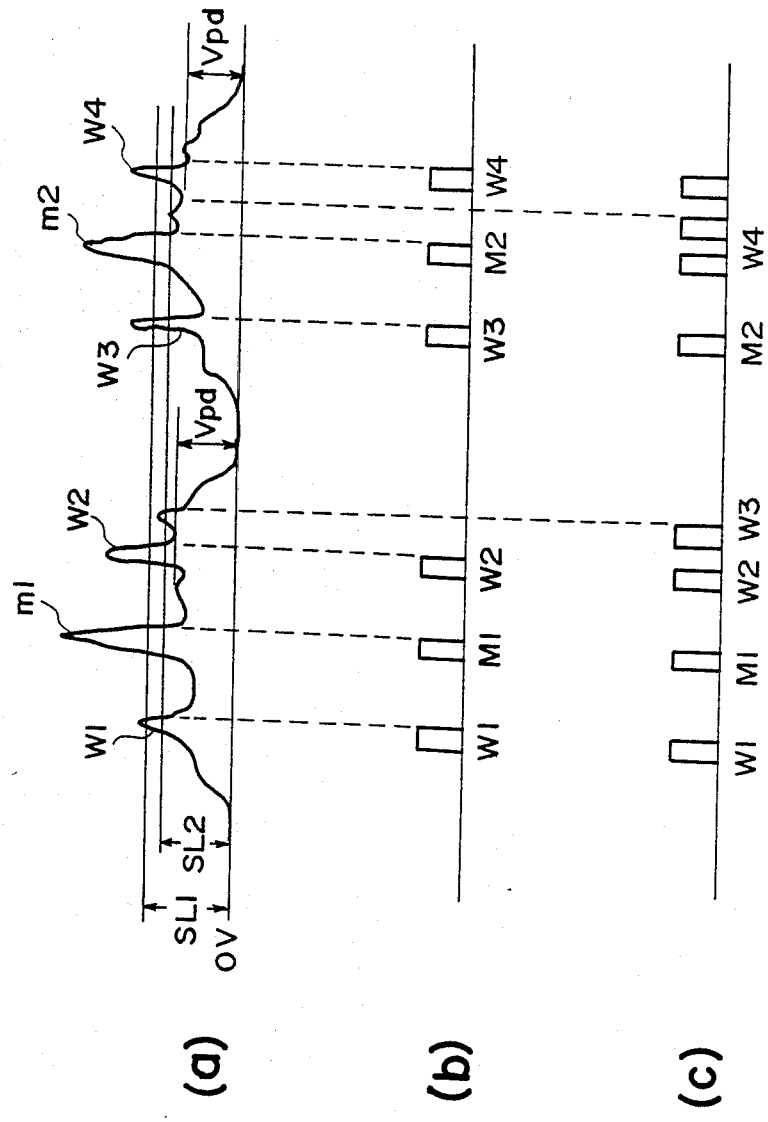
FIG. 3 is an explicative view showing an example of a detection signal having a large pedestal component and the timing for detecting mark signals.
Figure 4:
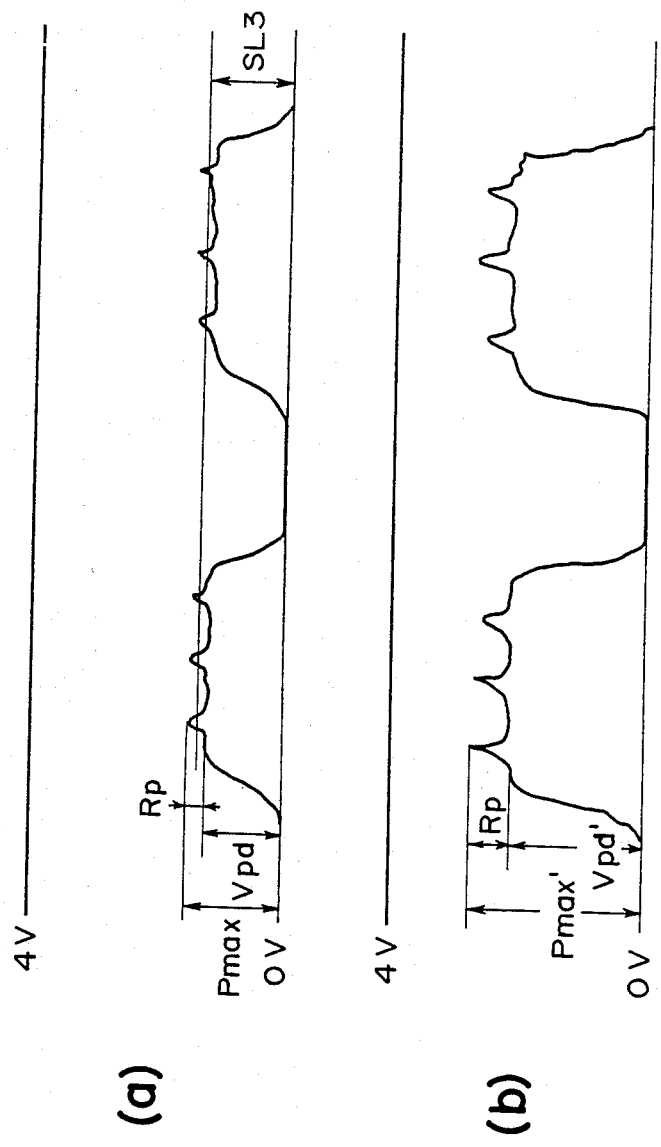
FIG. 4 is an explicative view showing an example of a detection signal having a large pedestal component and the manner of adjustment of an amplification rate.
Figure 24:
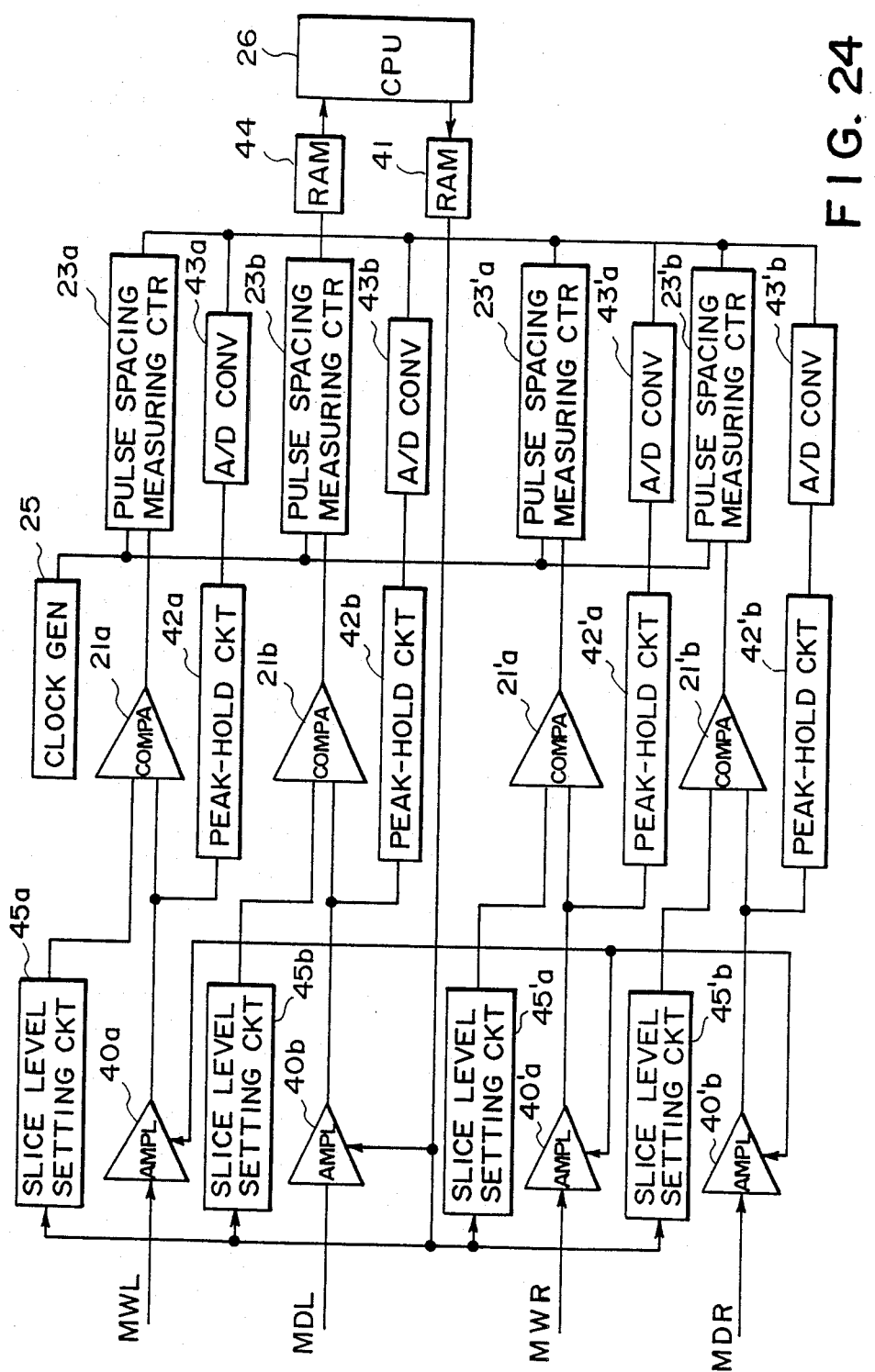
FIG. 24 is a block diagram showing an alignment device according to a still further embodiment of the present invention.

A further embodiment of the present invention will now be described with reference to FIG. 24. One of the important features of the present embodiment lies in that the output signals from the four photoelectric detectors 14L, 14R, 16L and 16R in the MWL-line, MWR-line, MDL-line and MDR-line (see FIG. 5) are processed in a parallel fashion. In the case of FIG. 8 arrangement, for example, selection is made on the MW-line signals and the MD-line signals, in respect to the distinction between the left-hand mark detecting line and the right-hand mark detecting line. And, the timing signal for the changeover is produced in response to the arrival of the pulse, as described in the foregoing. As a result, for the provision of left-hand and right-hand mark patterns such as shown in the portion (c) of FIG. 7 and for the use of two sheet-like laser beams having a spacing l such as shown in the portion (g) of FIG. 7, it is necessary that a margin $\Delta t$ is allowed between the signals R(−) to be picked up by the laser beam La and the signals L(+) to be picked up by the laser beam Lb, such as shown in the portion (e) of FIG. 7. Further, in one of the left-hand and right-hand detecting lines, selection is made on the MW-line signal and the MD-line signal. And, the selection signal to be supplied to each of the photoelectric detectors 14 and 16 from the CPU 26 is changed over in response to the arrival of the pulse, as described hereinbefore. So, if a noise signal N is included in the detection signal such as shown in the portion (a) of FIG. 2, it is possible that the selection signals are outputted in the manner shown in the portion (b) of FIG. 2. It is therefore possible that, during measurement of the pulse spacings, the noise signals and the signals from the mark patterns on the wafer are taken up as those in the pulse train such as shown in the portion (c) of FIG. 2. In the present embodiment, it is intended to reduce or suppress the possibility of such incorrect discrimination of the mark signals and also to reduce the time necessary for processing the detection signal. Also in this embodiment, elements having similar or corresponding functions as of those of the foregoing embodiments are denoted by the same reference numerals.

Of the left-hand and right-hand alignment marks WLn and WRn formed on the wafer 3 in connection with a shot area Sn, such as shown in FIG. 6, the left-hand alignment mark WLn provides a scatteringly reflected light which is directed to the left-hand side MW-line photoelectric detector 14L shown in FIG. 5 thus producing an MWL-line signal. Such output signal of the detector 14L is applied to an MW-line variable-gain amplifier 40a of the present embodiment, such as shown in FIG. 24. Similarly, the scatteringly reflected light from the right-hand alignment mark WRn formed on the wafer 3 for providing an MWR-line signal, the scatteringly reflected light from the left-hand alignment mark ML formed on the mask 1 providing an MDL-line signal, and the scatteringly reflected light from the right-hand alignment mark MR on the mask 1 providing an MDR-line signal are directed to variable-gain amplifiers 40b 40'a and 40'b, independently from each other. In the present embodiment, for the four detectors 14L, 14R, 16L and 16R of the MW-line detecting system and the MD-line detecting system in the left-hand and right-hand lines, four signal processing systems which are independent from each other are provided. And, the CPU 26 stores into the RAM 41 four gains effective to provide MWL-line signals, MWR-line signals, MDL-line signals and MDR-line signals of suitable level, and four threshold voltages which are to be outputted respectively to the comparators 21a, 21b, 21'a and 21'b. The values of outputs of the peak holding circuits 42a, 42b 42'a and 42'b and the data on the pulse spacings outputted from the pulse spacing measuring counters 23a, 23b, 23'a and 23'b are all stored into the RAM 44, each independently from the others.

Description will now be made to the timing for processing the MW-line signals and MD-line signals, particularly in the left-hand mark detecting line. For an unshown timing generating circuit, the CPU 26 sets time periods for allowing gating relative to the MW-line signals W1-W4, respectively, as shown in the portion (b) of FIG. 20, with reference to the rise of the synchronization signal Sync from the photoelectric detector 17L and, then, produces timing signals such as shown in the portion (c) of FIG. 20. The setting of the time periods from the CPU 26 is presettable. The peak detecting circuit 21a detects the peaks of the signals for the respective timing periods shown in the portion (c) of FIG. 20 and stores the values of detected peaks into the RAM 44, after converting them into digital data. The slice level setting circuit 42a is provided for the sake of processing of the MWL-line signals. It is adapted to convert, into analog data, the values stored in the RAM 41 by the CPU 26, and sets a corresponding threshold voltage in the comparator 21a of the MWL-line signal processing system.

Similarly, timing signals for the processing of the MDL-line signals is outputted from a timing generating circuit toward the components of the MW-line detecting system on the basis of the setting of time periods made with reference to the rise of the synchronization signal Sync from the photoelectric detector 17L. For such timing periods, each of the peak detecting circuit 42b, the slice level setting circuit 45b and the comparator 21b has substantially the same function as of that of corresponding component of the MW-line detecting system.

Of course, the right-hand signal processing system has substantially the same function as of that of the left-hand detecting line, in respect to the processing of the MWR-line signals and MDR-line signals.

In the example of FIG. 8 arrangement, the MW-line signals and the MD-line signals in the left-hand and the right-hand lines are detected in a time serial manner and the number of the detected pulses are counted, while the left-hand processing line and the right-hand processing line are changed over. So, there is a necessity of considering the inclusion of false signals (noise signals) and considering the margin in the scan of mark patterns by the laser beams having a spacing. In the present embodiment, as compared therewith, the changeover between the left-hand and the right-hand processing lines is not necessary and, therefore, the detection speed can be improved.

In the foregoing, the present invention has been described with reference to examples using a mask alignment marks and a wafer alignment mark, wherein, for the sake of alignment, the mask alignment mark is positioned between the mark patterns of the wafer alignment mark. However, use of such alignment marks is not indispensable and the present invention is applicable to such a case where a mask is fixedly held at a certain position and only one or more alignment marks formed on the wafer 3 are detected. That is, the positional deviation of the wafer 3 relative to the fixed position of the mask 1 is detected and, on the basis of the result of detection, the wafer is displaced so as to correct the positional deviation. Also, in some of the embodiments described hereinbefore, separate comparators are provided to detect the rise and the fall of the signal, respectively. Such two-comparator arrangement is not indispensable and a single-comparator arrangement may of course be adopted, such as in the other embodiment.

Also, use of a pulse synchronization circuit for picking up an output of the comparator is not indispensable. That is, such synchronization circuit can be omitted where the downstream portion of the signal processing system is arranged so as to be responsive to the edge triggers.

While the invention has been described with reference to the structures disclosed herein, it is not confined to the details set forth and this application is intended to cover such modifications or changes as many come within the purposes of the improvements or the scope of the following claims.

What is claimed is:

1. A device for adjusting the position of an object by use of marks formed in mark region defined on the object, said device comprising:
    scanning means for photoelectrically scanning the mark region, said scanning means producing an output related to the mark region;
    pulse producing means for producing a pulse each time said output comes into a predetermined state with respect to a predetermined reference;
    discrimination means for discriminating a relation between (i) a data corresponding to an interval between pulses produced by said pulse producing means and (ii) a reference data determined by a space between the marks with respect to the scanning direction of said scanning means;

detecting means for detecting, on the basis of the discrimination by said discrimination means, a mark data corresponding to the marks; and adjusting means for adjusting the position of the object in accordance with the mark data detected by said detecting means;

wherein said discriminating means operates first to set as a reference signal a first one of the pulses produced in the form of a train by said pulse producing means and operates to sequentially examine the intervals, with respect to time, between said reference pulse and each of the other pulses in the train until a predetermined relation is found between said data corresponding to the interval and said reference data, and wherein said discriminating means operates then to set as said reference signal a second one of the pulses in the train, said second pulse being subsequent to said first pulse with respect to time, when said predetermined relation is not found by the examination of a predetermined number of said intervals.

2. A device according to claim 1, wherein said discriminating means discriminates whether the following relation is satisfied:

$$0.95\ T_s < t_{n+1} - t_n < 1.05\ T_s$$

where $t_{n+1} - t_n$ is said data corresponding to the interval and $T_s$ is said reference data.

3. A device for adjusting the position of an object by use of marks in a mark region defined on the object, said device comprising:

scanning means for photoelectrically scanning the mark region, said scanning means producing an output related to the mark region;

pedestal subtracting means operable to integrate said output and to subtract a pedestal from said output in accordance with a result of the integration;

pulse producing means for producing a pulse each time said output forms comes into a predetermined state with respect to a predetermined reference;

discriminating means for discriminating a relation between (i) a data corresponding to an interval, with respect to time, between pulses produced by said pulse producing means and (ii) a reference data determined by a space between the marks with respect to the direction of scanning by said scanning means;

determining means for determining whether said subtracting means and said discriminating means are to be used for the extraction from said output of mark signals corresponding to the marks; and adjusting means for adjusting the position of the object in accordance with the mark signals.

4. A device according to claim 3, wherein said determining means is arranged to make the determination on the basis of the result of the integration.

* * * * *

UNITED STATES PATENT AND TRADEMARK OFFICE
CERTIFICATE OF CORRECTION

PATENT NO. : 4,830,500

DATED : May 16, 1989

INVENTOR(S) : YOICHI KUROKI ET AL.

It is certified that error appears in the above-identified patent and that said Letters Patent is hereby corrected as shown below:

IN THE DRAWINGS:

SHEET 22 OF 24

Fig. 23A, in each occurrence "DEVITION" should read --DEVIATION--.

SHEET 23 OF 24

Fig. 23B, in each occurrence "DEVITION" should read --DEVIATION--.

COLUMN 1

Line 23, "alignment," should read --alignment--.
    Line 45, "displaced)so" should read --displaced so--.
    Line 56, "park L." should read --path L.--.

COLUMN 8

Line 67, "from" should read --from the--.

COLUMN 9

Line 7, "arrive of" should read --arrive at--.

COLUMN 10

Line 53, "twmin" should read --$t_{WMIN}$--.

COLUMN 11

Line 8, "value t(n.1)" should read --value t(n+1)--.

UNITED STATES PATENT AND TRADEMARK OFFICE
CERTIFICATE OF CORRECTION

PATENT NO. : 4,830,500

DATED : May 16, 1989

INVENTOR(S) : YOICHI KUROKI ET AL.

Page 2 of 2

It is certified that error appears in the above-identified patent and that said Letters Patent is hereby corrected as shown below:

COLUMN 19

Line 39, "not discriminated" should read
        --not is discriminated--.

COLUMN 21

Line 68, "of that of" should read --that of the--.

COLUMN 22

Line 4, "of" (first occurrence) should be deleted.
    Line 22, "marks" should read --mark--.

Signed and Sealed this

Twenty-sixth Day of November, 1991

Attest:

HARRY F. MANBECK, JR.

*Attesting Officer*  *Commissioner of Patents and Trademarks*